(12) United States Patent
Miyamoto

(10) Patent No.: US 9,508,526 B2
(45) Date of Patent: Nov. 29, 2016

(54) TOP OPENING-CLOSING MECHANISM AND INSPECTION APPARATUS

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/568,596

(22) Filed: Dec. 12, 2014

(65) Prior Publication Data

US 2015/0221469 A1 Aug. 6, 2015

(30) Foreign Application Priority Data

| Dec. 13, 2013 | (JP) | 2013-257775 |
| Dec. 13, 2013 | (JP) | 2013-258484 |
| Dec. 27, 2013 | (JP) | 2013-273491 |
| Jan. 14, 2014 | (JP) | 2014-004137 |

(51) Int. Cl.
*H01J 37/16* (2006.01)
*H01J 37/20* (2006.01)
*H01J 37/18* (2006.01)

(52) U.S. Cl.
CPC ............... *H01J 37/16* (2013.01); *H01J 37/18* (2013.01); *H01J 37/20* (2013.01); *H01J 2237/0264* (2013.01); *H01J 2237/20292* (2013.01); *H01J 2237/26* (2013.01); *H01J 2237/3175* (2013.01)

(58) Field of Classification Search
None
See application file for complete search history.

(56) References Cited

U.S. PATENT DOCUMENTS

| 4,186,305 A | * | 1/1980 | Taoka | H01J 37/20 250/311 |
| 4,961,003 A | * | 10/1990 | Yonezawa | H01J 37/141 250/396 ML |
| 5,185,530 A | * | 2/1993 | Norioka | H01J 37/09 250/310 |
| 5,235,243 A | * | 8/1993 | Tong | H01J 29/867 174/391 |
| 5,254,856 A | * | 10/1993 | Matsui | H01J 37/12 250/441.11 |
| 5,853,176 A | * | 12/1998 | Kiriyama | B01J 3/006 220/681 |
| 8,884,253 B2 | * | 11/2014 | Rosenthal | B82Y 10/00 250/396 ML |
| 2001/0025931 A1 | * | 10/2001 | Takamatsu | H01J 37/304 250/491.1 |
| 2002/0038852 A1 | * | 4/2002 | Suzuki | H01J 37/09 250/396 ML |
| 2002/0096640 A1 | * | 7/2002 | Tanaka | B82Y 10/00 250/397 |
| 2002/0117969 A1 | * | 8/2002 | Suzuki | B82Y 10/00 315/85 |
| 2002/0153495 A1 | * | 10/2002 | Kageyama | B82Y 10/00 250/492.22 |
| 2006/0151712 A1 | * | 7/2006 | Moon | B82Y 10/00 250/396 ML |
| 2006/0196023 A1 | * | 9/2006 | Lee | H01L 21/6719 29/17.3 |
| 2009/0059773 A1 | * | 3/2009 | Obara | G11B 7/261 369/126 |
| 2010/0270299 A1 | * | 10/2010 | Baltussen | H01J 37/16 220/4.33 |
| 2011/0147609 A1 | * | 6/2011 | Shichi | H01J 27/26 250/400 |

(Continued)

FOREIGN PATENT DOCUMENTS

| JP | 55158890 A | * | 12/1980 | ............ B23K 15/00 |
| JP | H05-315221 A | | 11/1993 | |
| JP | H07-165066 A | | 6/1995 | |

(Continued)

*Primary Examiner* — Michael Logie
(74) *Attorney, Agent, or Firm* — Pearne & Gordon LLP

(57) ABSTRACT

A top opening-closing mechanism for opening and closing a top of a container including a container body and the top includes a rolling element rotatably provided at the top and positioned on the outside of the container body in a planar view, a rail, a jack for lifting the rail, and a top resting table disposed adjacent to the container and mounting the top thereon. When the top is opened, the jack lifts the rail, the rail lifts the rolling element from below, and thereby the top is lifted up from the container body. Then, the rolling element rolls on the rail and the top resting table to move the top from above the container body to the top resting table.

6 Claims, 37 Drawing Sheets

(56) References Cited

U.S. PATENT DOCUMENTS

2014/0138378 A1* 5/2014 Lequeux ............ A45C 13/1069
220/23.83
2016/0082557 A1* 3/2016 Friz ........................ B23P 19/06
29/525.02

FOREIGN PATENT DOCUMENTS

| JP | 2004-235226 A | 8/2004 |
| JP | 2010-056390 A | 3/2010 |
| JP | 2011-065956 A | 3/2011 |

\* cited by examiner (a)　　　　　　　　　　　(b)

TOP OPENING-CLOSING MECHANISM AND INSPECTION APPARATUS

TECHNICAL FIELD

The present technique relates to a container used for a semiconductor producing apparatus for processing an object, an inspection apparatus for inspecting an object, or the like.

Conventionally, a semiconductor producing apparatus for finely processing an object to be processed or an inspection apparatus for inspecting a finely processed object or the like uses a stage holding the object and moved to any position. The processing or inspection of a semiconductor may require a vacuum, and in a vacuum, the stage is disposed in a container (chamber) configured to hold a vacuum condition.

The object of the present technique is to provide a novel container used for the semiconductor producing apparatus for processing an object, the inspection apparatus for inspecting an object, or the like.

According to a first aspect of the present technique, there is provided a top opening-closing mechanism for opening and closing a top of a container including a container body and the top. The top opening-closing mechanism includes a rolling element rotatably provided at the top and positioned on the outside of the container body in a planar view, a rail, a lifting unit configured to lift the rail, and a top resting table disposed adjacent to the container and configured to mount the top thereon. The top opening-closing mechanism has a configuration in which when the top is opened, the rail is lifted by the lifting unit, the rail lifts the rolling element from below to lift the top from the container body, the rolling element rolls on the rail and the top resting table, and the top is moved from above the container body to the top resting table.

According to a second aspect of the present technique, a laser interferometer measures the position of an object to be measured by emitting a laser beam to reflecting mirrors mounted on the object to be measured, and has a reflecting mirror supporting structure. In the reflecting mirror supporting structure, a reflecting mirror holder having a recessed portion including a seat surface configured to mount the reflecting mirror thereon is fixed to the object to be measured, the reflecting mirror is mounted on the seat surface of the reflecting mirror holder and a lower surface portion and at least one of a front surface portion or a back surface portion of the reflecting mirror are supported by the recessed portion, a retaining plate including an elastic body on one side thereof is disposed so that the elastic body faces the front surface portion or the back surface portion of the reflecting mirror mounted on the seat surface. While the elastic body is pressed against the front surface portion or the back surface portion of the reflecting mirror, and the elastic body is elastically urged to a surface opposite to the surface against which the elastic body is pressed, the reflecting mirror is held by the reflecting mirror holder, and the laser beam is emitted from the laser interferometer to the front surface portion of the reflecting mirror.

According to a third aspect of the present technique, in a structure for mounting a stage in a vacuum container mounted on a stone surface plate, a rail portion of a linear guide configured to guide linear movement of a movable portion of the stage is directly mounted to an upper surface of the stone surface plate facing a lower surface of the bottom plate through an opening portion formed in a bottom plate of the vacuum container.

According to a fourth aspect of the present technique, an electron beam apparatus has a vacuum magnetic shield container including a stage configured to hold a sample. The vacuum magnetic shield container includes an inner container including a steel material without requiring anti-corrosion treatment, an outer container including a magnetic steel material different from the material of the inner container and disposed to surround the inner container. The inner container holds a vacuum in the container, and the outer container magnetically shields the container.

DETAILED DESCRIPTION

Figure 1:
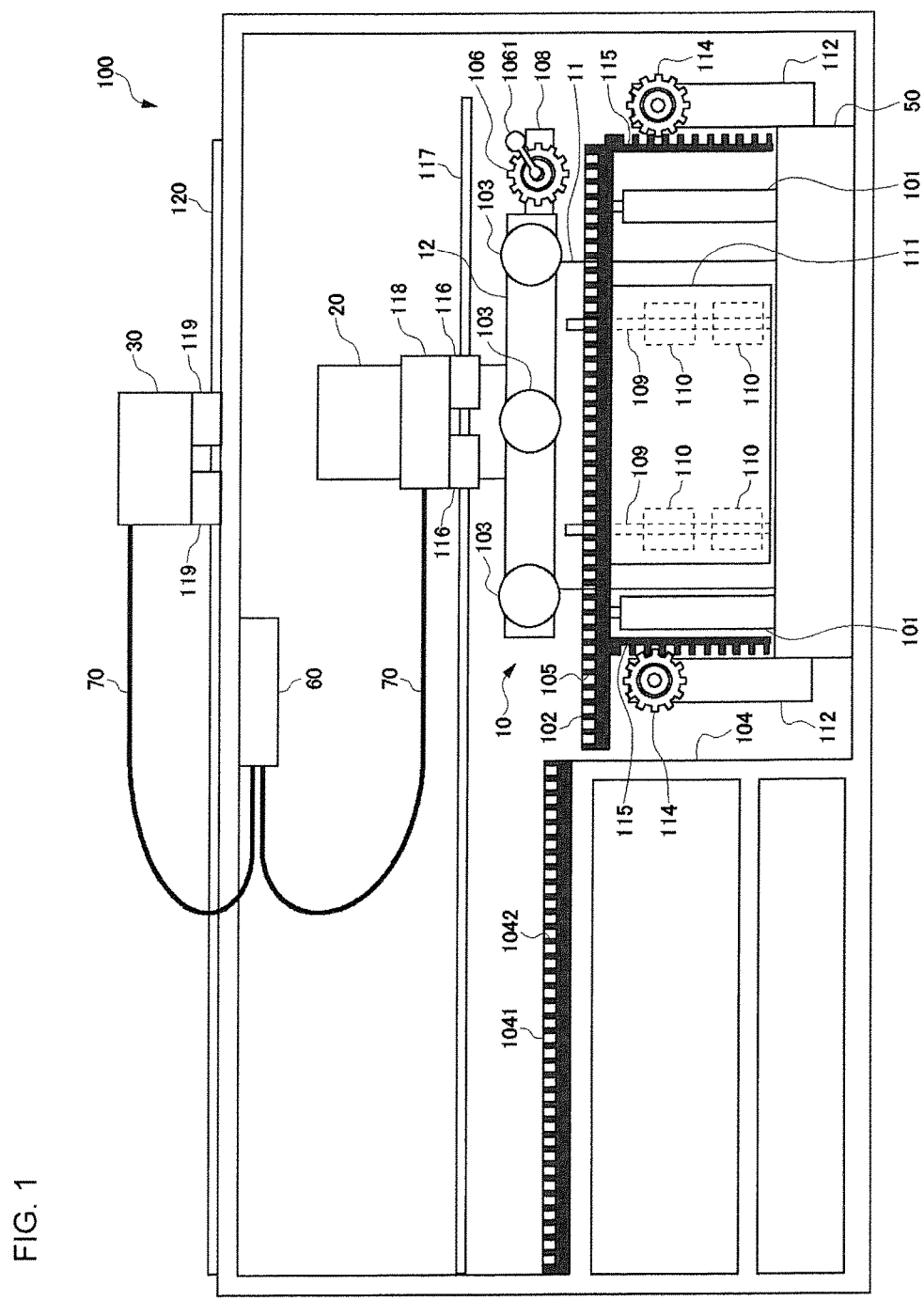
FIG. 1 is a schematic side view illustrating a main configuration of an inspection apparatus including a top opening-closing mechanism according to a first embodiment.

First to fourth embodiments of the present technique will be described below. It is to be assumed that the first to fourth embodiments described below can be made by being arbitrarily combined with each other.

<First Embodiment: Top Opening-closing Mechanism and Inspection Apparatus>

(Field)

The present embodiment relates to an opening-closing mechanism for a top (upper plate) of a container used for a semiconductor producing apparatus for processing an object, an inspection apparatus for inspecting an object, or the like.

(Background)

Conventionally, a semiconductor producing apparatus for finely processing an object to be processed or an inspection apparatus for inspecting a finely processed object or the like uses a stage holding the object and moved to any position. The processing or inspection of a semiconductor may require a vacuum, and in a vacuum, the stage is disposed in a container (chamber) configured to hold a vacuum condition.

It is necessary to access a stage disposed in a container upon failure, repair, or maintenance of a stage. Conventionally, containers have a side portion provided with an opening-closing door for access to the stage. Alternatively, there have been also containers having a part provided with an opening portion normally covered with a lid or the like, and handled by removing the lid or the like therefrom only when necessary. Further, there have been also containers having a top (upper plate) portion opened entirely (top opening) to maximize access to a stage.

As a related art of the present embodiment, JP 07-165066 A discloses an inspection apparatus partially moved by a mechanical unit.

(Summary)

However, in the containers having a side portion provided with an opening/closing door or the containers having a part provided with an opening portion normally covered with a lid or the like, and handled by removing the lid or the like therefrom only when necessary, an accessible range to the stage is limited to the door or the opening portion mounted with the lid, and workability or efficiency in repairing or maintenance is considerably reduced. Further, accuracy of the work is also reduced, and reliability of the apparatus is also reduced. On the other hand, even the containers having a mode of access to the stage by entirely opening the top of the container (top opening) has the following problems.

The containers have various sizes depending on objects to be processed or inspected or the sizes of stages according to the objects, but the containers often have a cubic shape having a side of approximately 1 m. The containers are evacuated, so that the containers need to have a rigidity high enough to endure a differential pressure between the inside and outside of the containers, and the containers have an increased wall thickness. Further, on the top, a column is disposed as a device configured to perform processing or inspection, and the total weight of the top and the column may reach 1 t or more.

Therefore, it is difficult to open the top, in the containers having the mode of maximum access to the stage by entirely opening the top of the container (top opening). Consequently, an increased repairing or maintenance time or human hour is required, and the apparatus comes to have an increased down time (non-operation time).

The present embodiment has been made in view of the above problems, and it is an object of the present technique to provide a top opening-closing mechanism for readily opening and closing a top of a container.

According to a first aspect of the present embodiment, the top opening-closing mechanism for opening and closing a top of a container including a container body and a top includes a rolling element rotatably provided at the top and positioned on an outside of the container body in a planar view, a rail, a lifting unit configured to lift the rail, and a top resting table disposed adjacent to the container and configured to mount the top thereon. The top opening-closing mechanism has a configuration in which when the top is opened, the rail is lifted by the lifting unit, the rail lifts the rolling element from below to lift the top from the container body, the rolling element rolls on the rail and the top resting table, and the top is moved from above the container body to the top resting table.

Owing to this configuration, the rolling element is provided at the top to be positioned on the outside of the container body, thereby, when the top is opened, the rolling element is lifted up from below to lift up the top from the container body. Accordingly, operation of lifting the top from the container body and operation of laterally moving the top having been lifted can be continuously performed, and the top of the container can readily opened.

In the top opening-closing mechanism, it is preferable that, when the top is closed, the rolling element rolls on the top resting table and the rail to cause the top to be moved from the top resting table to above the container body, then the rail is lowered by the lifting unit to cause the top to be lowered, and the top is mounted on the container body.

Owing to this configuration, when the top is closed, the top is returned to the container body by the reverse operation to opening the top, and the top of the container can be readily closed.

In the top opening-closing mechanism, it is preferable that, when the top is opened, the lifting unit lifts the rail up to a height the same as that of the top resting table.

Owing to this configuration, when the top is opened, the rolling element is continuously rolled from the rail to the top resting table, and the top can be moved to the top resting table.

The top opening-closing mechanism preferably further includes a lateral movement mechanism for applying a lateral driving force to move the top from the rail to the top resting table.

This configuration can laterally move the top supported on the rail by the rolling element smoothly. Preferably, the lateral movement mechanism includes, for example, a spur gear provided on the top side and a rack gear provided on the rail side, and the spur gear meshes with the rack gear when the rolling element is supported on the rail. In this configuration, the spur gear is rotated to move the top laterally on the rail.

Preferably, the top opening-closing mechanism further includes a horizontal position maintaining mechanism for maintaining the top horizontally to lift up the top.

Owing to this configuration, the top is lifted up from the container body while being maintained horizontally. Therefore, disadvantageous concentration of loads on any of hydraulic jacks is reduced or inhibited, when a plurality of hydraulic jacks having the same driving source are used as the lifting unit. Preferably, the horizontal position maintaining mechanism includes, for example, a plurality of guide blocks positionally fixed to the rail, and a plurality of guide rails positionally fixed to the container body, and the guide blocks are vertically driven along the guide rails to correct the inclination of the top. Further preferably, the horizontal position maintaining mechanism includes a plurality of rack gears positionally fixed to the rail, and a plurality of gears meshing with the plurality of rack gears, respectively, fixed to one rotatable shaft positionally fixed to the container body, and the plurality of rack gears rotate, as the rail is lifted, the corresponding gears to correct the inclination of the top.

In the top opening-closing mechanism, a structure is preferably mounted on the top. The top opening-closing mechanism preferably further includes a structure movement supporting mechanism for supporting the movement of the structure with the movement of the top.

Owing to this configuration, the structure mounted on the top can be smoothly moved with the top. It is preferable that the structure includes, for example, a column of the inspection apparatus or the semiconductor producing apparatus.

In the top opening-closing mechanism, an accessory device incidental to the structure is preferably connected to the structure. The top opening-closing mechanism preferably further includes the accessory device moving mechanism for moving the accessory device in synchronization with the movement of the structure.

Owing to this configuration, when the structure is laterally moved with the top, the accessory device can be also laterally moved following the movement of the structure.

Preferably, in the top opening-closing mechanism, the structure and the accessory device are connected by wire and/or pipe. The top opening-closing mechanism preferably further includes a storage box configured to store the wire and/or pipe, and not moved even when the structure and the accessory device are moved. The wire and/or pipe is preferably stored in flexible Cableveyor (registered trademark).

Owing to this configuration, the structure or the accessory device can be laterally moved smoothly without obstruction of the wire or the pipe connecting between the structure and the accessory.

In the top opening-closing mechanism, the wire and/or pipe is preferably connected to the structure through a connection housing.

Owing to this configuration, the wire or the pipe is connected to the structure through the connection housing, disadvantageous obstruction of the lateral movement of the structure due to complicated entanglement of the wire or pipe near a connecting point with the structure can be reduced or prevented, and the wire or pipe does not need to be disconnected from the structure to laterally move the structure with the top.

Preferably, in the top opening-closing mechanism, the structure is mounted on the top, and the top opening-closing mechanism further includes a structure moving mechanism for partially moving the structure independently of the movement of the top.

This configuration facilitates the attachment or detachment of the structure mounted on the top, with respect to the top, maintenance thereof, or the like.

According to the present embodiment, an inspection apparatus for inspecting an object to be inspected includes a container including a top, and a container body configured to house the object to be inspected, a column provided on the top, and configured to irradiate the object to be inspected housed in the container with a beam, and a top opening-closing mechanism configured to open and close the top. The top opening-closing mechanism includes a rolling element rotatably provided at the top and positioned on an outside of the container body in a planar view, a rail, a lifting unit configured to lift the rail, and a top resting table disposed adjacent to the container and configured to mount the top thereon. The top opening-closing mechanism has a configuration in which when the top is opened, the rail is lifted by the lifting unit, the rail lifts the rolling element from below to lift the top from the container body, the rolling element rolls on the rail and the top resting table, and the top is moved from above the container body to the top resting table.

Owing to this configuration, the rolling element is provided at the top to be positioned on the outside of the container body, thereby, when the top is opened, the rolling element is lifted up from below to lift up the top from the container body. Accordingly, operation of lifting the top from the container body and operation of laterally moving the top having been lifted can be continuously performed, and the top of the container can readily opened.

According to the present embodiment, when the top is opened, the rolling element provided at the top is lifted up from below to lift up the top from the container body. Accordingly, the operation of lifting the top from the container body and operation of laterally moving the top having been lifted can be continuously performed, and the top of the container can readily opened.

Specific Configuration

The top opening-closing mechanism according to the present embodiment will be described below with reference to the drawings. It should be understood that the present embodiment described below is intended to be illustrative only, and not limited to the specific construction described below. Now description will be made below of an example of the top opening-closing mechanism of the present embodiment which is employed for a vacuum container configured to house a stage of the inspection apparatus, but the top opening-closing mechanism of the present embodiment can be also applied as a mechanism for opening and closing a top of a vacuum container of another apparatus such as a semiconductor producing apparatus.

FIG. 1 is a schematic side view illustrating a main configuration of the inspection apparatus including the top opening-closing mechanism according to the present embodiment. An inspection apparatus 100 includes a vacuum container (hereinafter simply referred to as a "container") 10, a column 20, an accessory device 30, a housing 40, and the top opening-closing mechanism. The container 10 and the column 20 are mounted in the housing 40. It is noted that, in the following description a rightward and leftward direction in FIG. 1 is represented as a right-left direction, a lateral direction, or a horizontal direction, an upward and downward direction in FIG. 1 is represented as an up-down direction, longitudinal direction, or a vertical direction, and a vertical direction with respect to the drawing of FIG. 1 is represented as a depth direction (back side, front side), relative to the inspection apparatus 100.

The container 10 has a substantially rectangular parallelepiped shape including a bottom plate, a right side plate, a left side plate, a front plate, a back plate, and an upper plate, or the top. The bottom plate, the right side plate, the left side plate, the front plate, and the back plate are integrally configured (hereinafter referred to as a "container body 11"), and a top 12 is configured to be removed from the container body 11. In the container 10, a stage is disposed for mounting a sample.

The column 20 has a substantially cylindrical shape. The column 20 is mounted on the top 12 of the container 10. The column 20 forms the beam irradiating the sample in the container 10. The top 12 of the container 10 has a recessed portion configured to mount the column 20 at substantially the center thereof. The recessed portion transmits the beam formed at the column 20. The beam formed at the column 20 is applied to the sample put on the stage in the container 10 through the recessed portion. Further, a beam from the sample is also input to the column 20 through the recessed portion of the top 12. It is noted that the column 20 corresponds to the structure.

The container 10 is mounted on a surface plate 50 having a high rigidity. The surface plate 50 is mounted on an anti-vibration device not illustrated in FIG. 1. The column 20 and the accessory device 30 are connected with each other by the wire and the pipe through a storage box 60 fixed to the housing 40. The wire and the pipe are housed in flexible Cableveyors 70.

Figure 2:
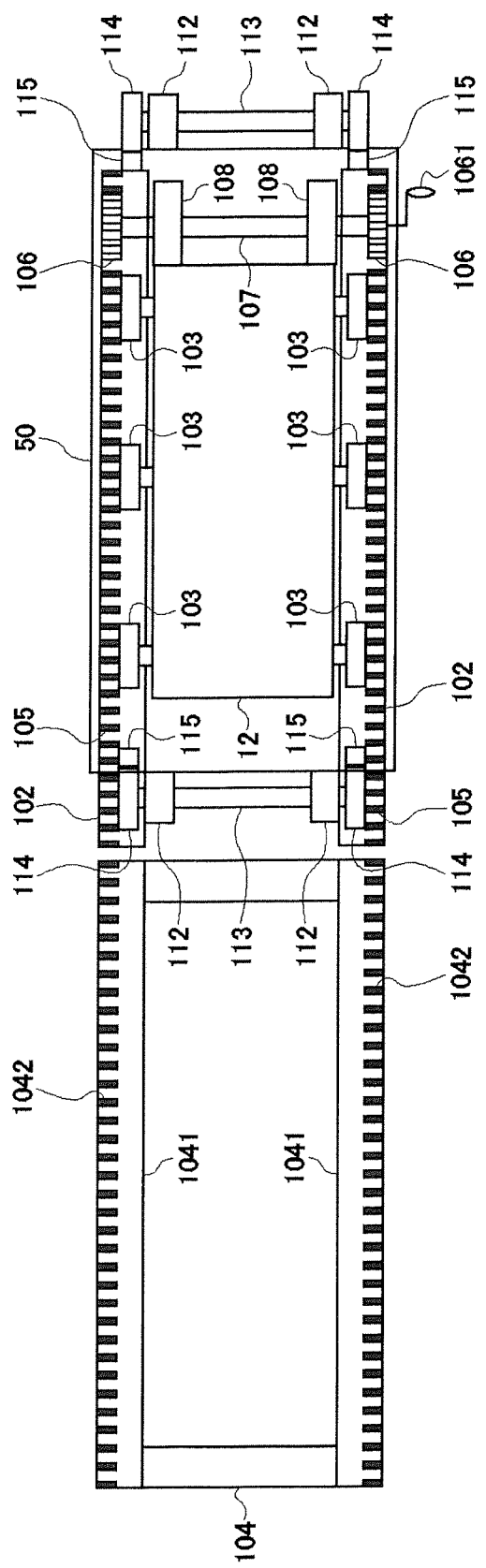
FIG. 2 is a schematic plan view illustrating a main configuration of the top opening-closing mechanism according to the first embodiment.

In the housing 40, the top opening-closing mechanism is further provided for opening and closing the top 12 of the container 10. FIG. 2 is a schematic plan view illustrating a main configuration of the top opening-closing mechanism according to the present embodiment. The top opening-closing mechanism will be described below with reference to FIGS. 1 and 2. The inspection apparatus 100 includes, as the top opening-closing mechanism, a jack 101, a rail 102, a rolling element 103, a top resting table 104, a lateral movement mechanism, a horizontal position maintaining mechanism, a column movement supporting mechanism, and an accessory device moving mechanism.

The jacks 101 include a hydraulic jack. The jacks 101 are externally provided at four corners of the container 10. The four jacks 101 are driven by the same driving source (hydraulic source). Two of the four jacks 101, on the front side, have ends between which one of the rails 102 is mounted to be on the front side. Two of the four jacks 101, on the back side, have ends between which the other of the rails 102 is mounted to be on the back side. The two jacks 101 on the front side vertically lifts or lowers the rail 102 on the front side, the two jacks 101 on the back side vertically lifts or lowers the rail 102 on the back side. That is, each of the two rails 102 is supported at both ends by the two jacks 101 to form a double-supported beam. It is noted that the jacks 101 correspond to the lifting unit.

The rolling elements 103 represent rollers rotatably provided on side surfaces on the front and back sides of the top 12 (i.e., the front surface and the back surface). The side surfaces on the front and back sides of the top 12 are provided with three rolling elements 103 at substantially equal intervals, respectively. As illustrated in FIG. 2, the rolling elements 103 are positioned on the outside (the front and back sides) of the container body 11 and the top 12, in a planar view. In addition, an interval between each rolling element 103 on the front side and the corresponding rolling element 103 on the back side is the same as an interval between the two rails 102. In a planar view, the rolling element 103 on the front side and the rail 102 on the front side overlap with each other, and the rolling element 103 on the back side and the rail 102 on the front side overlap with each other.

The resting table 104 configured to mount the top 12 thereon is provided beside the container 10. The top resting table 104 has an upper surface formed with rails 1041 configured to support the rolling elements 103 of the top 12. Each of the rails 1041 of the top resting table 104 has an upper surface (rolling element supporting surface) located at a position higher than a lower end of the rolling element 103 when the top 12 covers the container body 11. Further, the rail 1041 of the top resting table 104 continues to the rail 102 having been lifted up to the height of the rail, and the rolling element 103 is rotatably moved from the rail 102 to the rail 1041. In this case, the rail 102 and the rail 1041 may be in contact with each other, or may be separated from each other to have an interval small enough to prevent the rolling element 103 from falling therebetween.

The top opening-closing mechanism includes, as the lateral movement mechanism, rack gears 105 each formed on the outside of the rail 102 in a right-left direction (i.e., movement direction of the top 12), rack gears 1042 each formed on the outside of the rail 1041 of the top resting table 104 in a right-left direction (i.e., movement direction of the top 12), and spur gears 106 each engaging with the rack gears 105 and 1042. The rack gears 105, the rack gears 1042, and the spur gears 106 are provided on both of the front and the back sides of the container 10, respectively.

Two spur gears 106 are connected with each other by a shaft 107, the shaft 107 is rotatably supported by shaft holders 108 fixed to a side surface of the top 12. One of the spur gears 106 which is on the front side includes a rotating handle 1061 configured to allow a user to rotate and move the spur gear 106 on the rack gears 105 and 1042.

The rack gears 105 and the spur gears 106 are respectively disposed to be meshed with each other, when the rails 102 are lifted up and the rolling elements 103 are supported on the rails 102. Further, the rack gears 1042 of the top resting table 104 are also disposed so that the spur gears 106 are meshed with the rack gears 1042 when the rolling elements 103 are supported on the rails 1041.

Each rack gear 1042 of the top resting table 104 is positioned at the same height as that of the rack gear 105, and continues to each rack gear 105, when the rail 102 is lifted up to the height of the rail 1041 of the top resting table 104. Therefore, the spur gear 106 can be rotatably moved from the rack gear 105 to the rack gear 1042. At this time, the rack gear 105 and the rack gear 1042 may be in contact with each other, or may be separated from each other to have an interval small enough to prevent the spur gear 106 from falling therebetween.

In the present embodiment, the handle 1061 is used to manually rotate the spur gear 106, but the spur gear may be rotated by another driving force such as an electric motor. In addition, an operating force may be reduced by a decelerator or the like, according to a load such as a top load. Further, in the present embodiment, a mechanism including the rack gear and the spur gear is employed, as the lateral movement mechanism, but another mechanism including a ball screw or the like may be employed.

The top opening-closing mechanism includes, as the horizontal position maintaining mechanism, a linear guide rail 109, a guide block 110, a connection plate 111, a shaft holder 112, a shaft 113, a spur gear 114, and a rack gear 115. The horizontal position maintaining mechanism for a right-left direction includes the linear guide rails 109, the guide blocks 110, and the connection plate 111, and prevents the inclination of the top 12 which is caused by backward axial rotation. The horizontal position maintaining mechanism for a backward direction includes the shaft holders 112, the shafts 113, the spur gears 114, and the rack gears 115, and prevents the inclination of the top 12 which is caused by right-left axial rotation.

The horizontal position maintaining mechanism for a right-left direction is provided only on the front side of the container 10. The horizontal position maintaining mechanism for a right-left direction is provided only on the front side of the container 10, but may be provided only on the back side or on both front and back sides. The horizontal position maintaining mechanism for a backward direction is provided on both right and left sides of the container 10, but may be provided only on one side.

The linear guide rails 109 are fixed to the container body 11. Two linear guide rails 109 are spaced apart in a right-left direction. Each of the linear guide rails 109 has a rod shape, and is provided longitudinally vertically. The linear guide rail 109 may be fixed to the surface plate 50.

Each of the guide blocks 110 is moved on the linear guide rail 109 along the longitudinal direction of the linear guide rail 109. Two guide blocks 110 are provided on the upper and lower sides of each linear guide rail, and four guide blocks are provided in total. The four guide blocks 110 are fixed to the connection plate 111.

The connection plate 111 is fixed to the lower side of the rail 102. That is, the connection plate 111 connects the rail 102 and the four guide blocks 110, and constantly maintains a positional relationship between the rail and guide blocks.

Therefore, the plurality of right and left guide blocks 110 mutually performs positional restriction and maintenance during up and down movement, and the position of the rail 102 can be maintained without generating the inclination of the rails 102 caused by the backward axial rotation. In FIG. 1, the four guide blocks 110 are illustrated, but the positional restriction and maintenance by the connection plate 111 is effected even if only one guide block 110 is employed. Therefore, the number of guide blocks 110 may be determined to increase the positional restriction and maintenance effect according to the degree of obstruction to the horizontal position, such as offset load of the top 12.

The shaft holders 112 are fixed to the surface plate 50. Each of the shaft holders 112 has a pillar shape. Two shaft holders 112 are spaced apart in a backward direction, respectively. Each of the shafts 113 are rotatably supported horizontally by the two shaft holders 112. The shaft 113 has both ends each fixed with the spur gear 114. That is, two spur gears 114 are rotatably supported at positions having the same height.

The rack gears 115 are fixed to the rails 102. Each of the rack gear 115 has a gear formed vertically. Two rack gears 115 are spaced apart in a backward direction, respectively, to be engaged with the two spur gears 114. The rack gear 115 is mounted to a position to have a length long enough to constantly engage with the spur gear 114 within a range in which the rail 102 is driven up and down.

Figure 3:
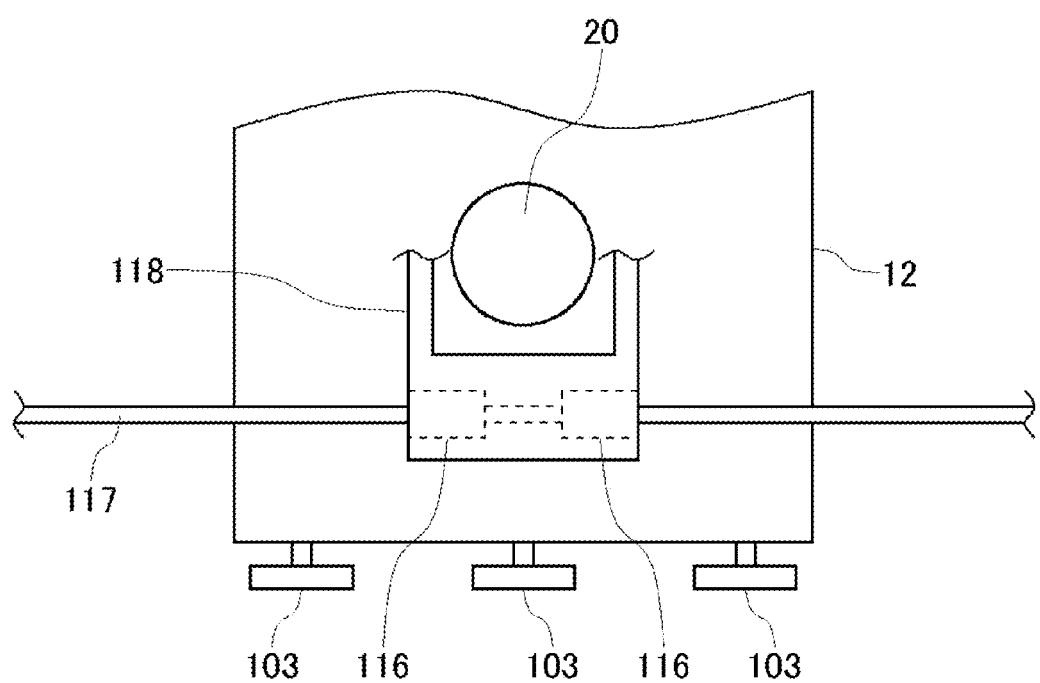
FIG. 3 is a schematic plan view illustrating a configuration of a column movement supporting mechanism according to the first embodiment.

The top opening-closing mechanism includes guide blocks 116 and a rail 117, as a mechanism for supporting lateral movement of the column 20 as the structure on the top with the lateral movement of the top 12, or as the column movement supporting mechanism. FIG. 3 is a plan view illustrating the column movement supporting mechanism. The rail 117 is fixed in the housing 40 to longitudinally extend in a right-left direction (horizontal direction). The wire and the pipe connected to the column 20 are housed in flexible Cableveyor as described above, and the wire and the pipe housed in the Cableveyor 70 are connected to a necessary point of the column 20 or another structure on the top through a connection housing 118 fixed to the guide blocks 116. The connection housing 118 is mounted to have a space between the connection housing and the column 20 or the structure on the top in a right-left direction, and therefore, when the top 12 is laterally moved, the space is eliminated for connection, and the top 12 and the column 20 are integrally moved in a lateral direction. That is, the guide blocks 116 are moved in a right-left direction along the rail 117.

The top opening-closing mechanism includes guide blocks 119, and a rail 120, as the accessory device moving mechanism for moving the accessory device 30 in a lateral direction in synchronization with the lateral movement of the column 20. The guide blocks 119 are fixed to the lower side of the accessory device 30. The rail 120 is fixed to the upper surface of the housing 40 to longitudinally extend in a right-left direction. The guide blocks 119 are moved integrally with the accessory device 30 in a right-left direction along the rail 120.

Description will be made of the operation of the top opening-closing mechanism configured as described above. In the following description, opening operation in which the top 12 is removed from the container body 11 and put on the top resting table 104 will be described, but closing operation for returning the top 12 having been put on the top resting table 104 to the container body 11 is the reverse of the opening operation.

First, description will be made of a condition in which the top 12 is mounted on the container body 11, and the container 10 is hermetically closed. FIG. 1 illustrates this condition, the rail 102 is positioned below the top 12 and the rolling elements 103 provided on the side surface of the top 12, and the rail 102 is not in contact with the rolling elements 103.

Figure 4:
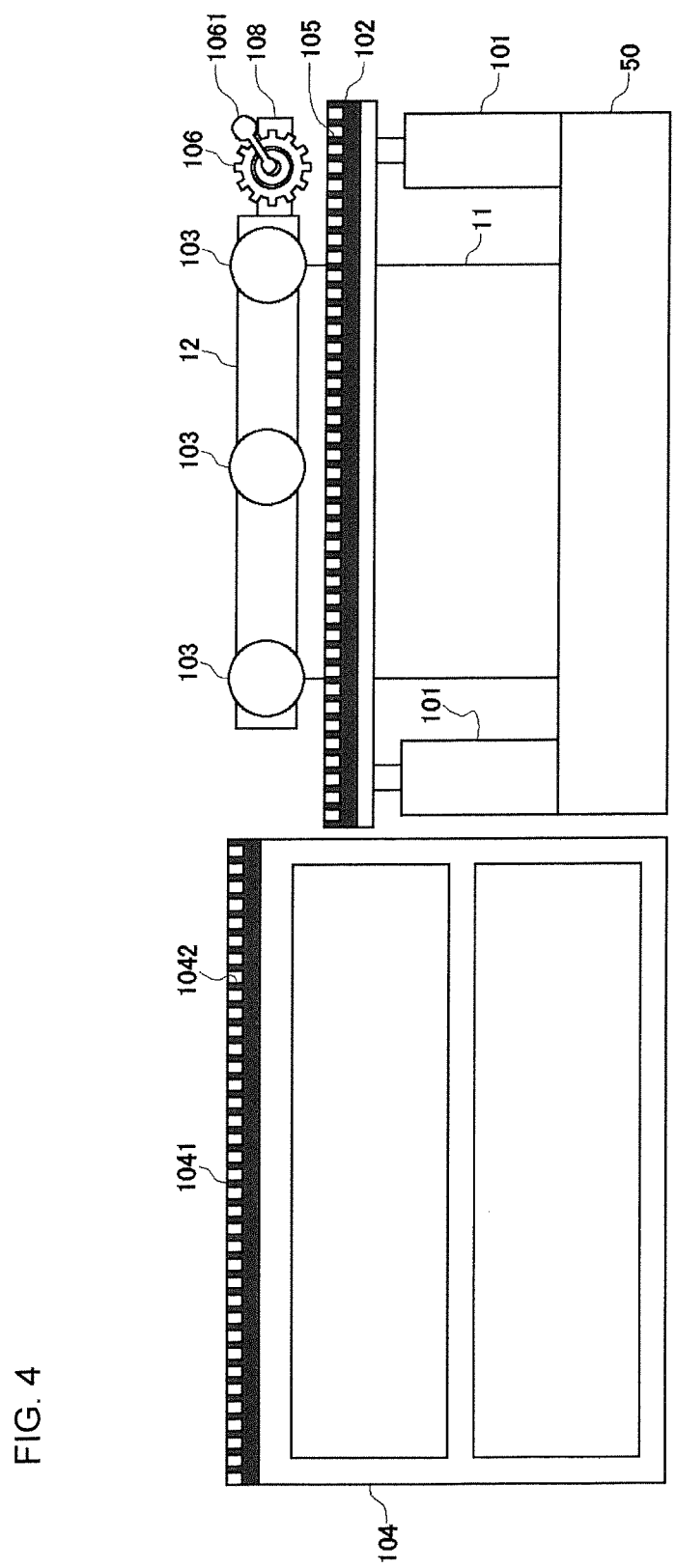
FIG. 4 is a diagram illustrating top opening operation according to the first embodiment.
Figure 5:
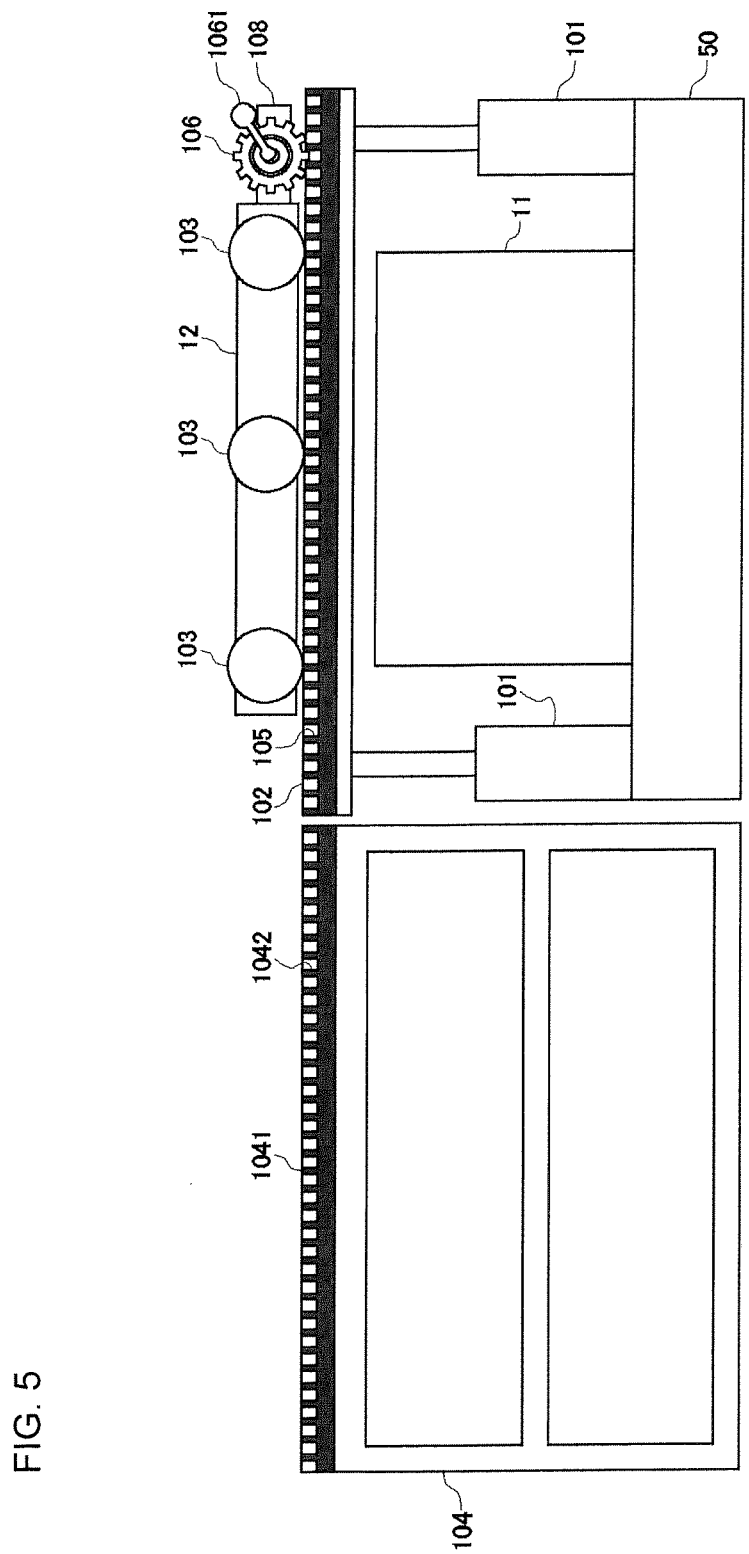
FIG. 5 is a diagram illustrating the top opening operation according to the first embodiment.
Figure 6:
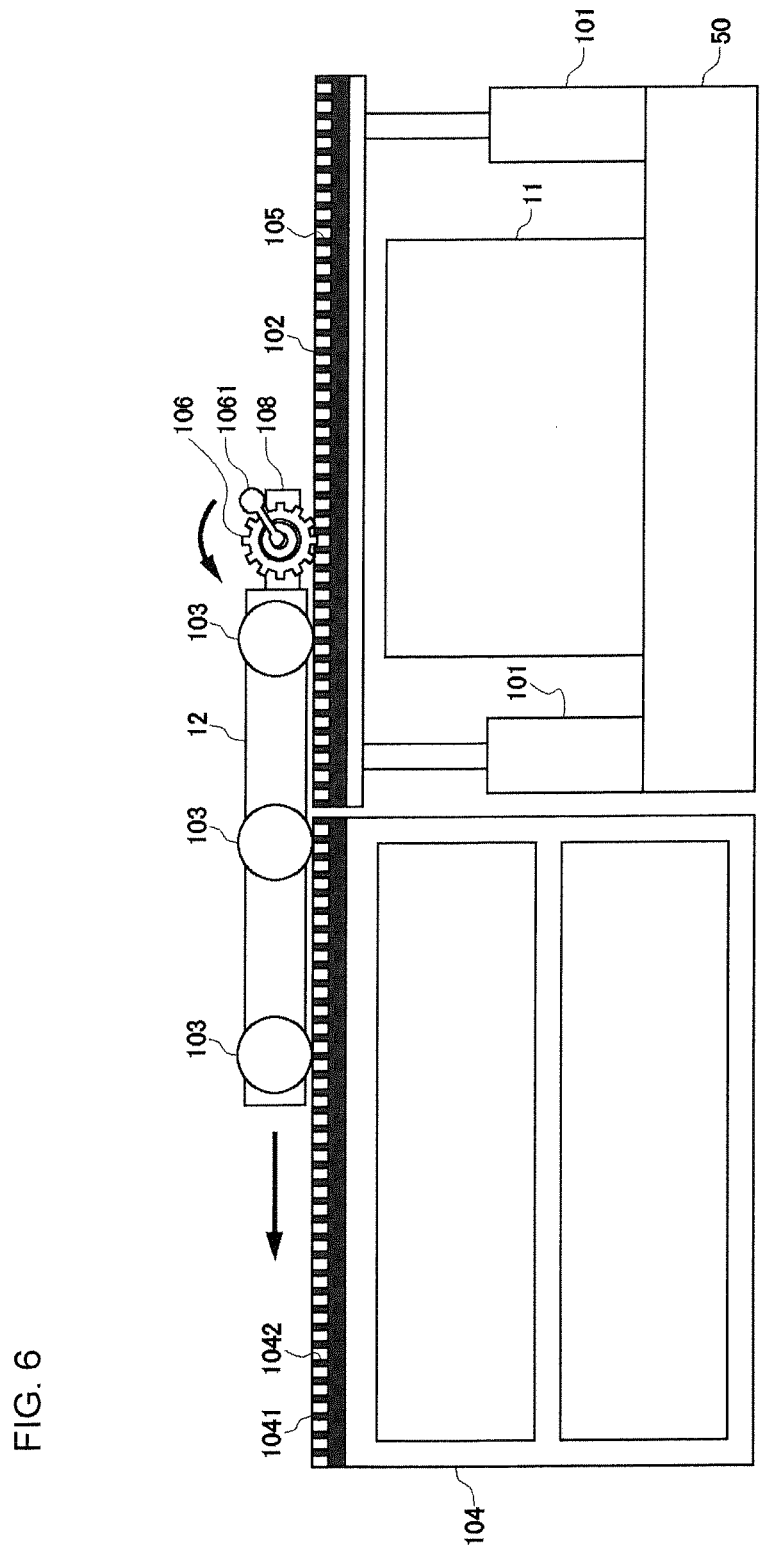
FIG. 6 is a diagram illustrating the top opening operation according to the first embodiment.

FIGS. 4 to 6 are diagrams illustrating the opening operation of the top 12. It is noted that, in FIGS. 4 to 6, only elements required for description of the movement of the top 12 are illustrated, and the other elements are not illustrated. When the top 12 is removed, first, the rail 102 is lifted up by the jacks 101. Then, the rail 102 makes contact with the rolling elements 103 from below. When the rail 102 is further lifted up by the jacks 101, the rolling elements 103 having been supported by the rails 102 from below are lifted up, as illustrated in FIG. 5, and the top 12 is lifted upward from the container body 11. The rail 102 is lifted up by the jacks 101 up to a height the same as that of the rail 1041 of the top resting table 104, and stops there (condition illustrated in FIG. 5).

Next, the user turns the rotating handle 1061 to rotate the spur gear 106 while meshing with the rack gear 105, thereby the rolling elements 103 are rolled on the rail 102, and the top 12 is moved laterally toward the top resting table 104. When the top 12 reaches the top resting table 104, as illustrated in FIG. 6, the rolling elements 103 under the top 12 transfer from the rail 102 to the rail 1041 of the top resting table 104, and roll on the rail 1041.

When the user further turns the rotating handle 1061 to move the top 12 toward the top resting table 104, all of the rolling elements 103 of the top 12 are entirely removed from the rail 102, and supported by the rail 1041 of the top resting table 104. It is noted that after the top 12 has been moved onto the top resting table 104, the spur gear 106 is also meshed with the rack gear 1042 of the top resting table 104, and rotatably moved on the rack gear 1042.

By such opening operation of the top 12, the top 12 is lifted upward and then moved laterally. Thereby, the upper surface of the container body 11 is opened, and access to the inside of the container 10 is allowed. At this time, the top 12 is lifted up by the jacks 101, and thus the top 12 having a large weight can be readily lifted up. In addition, the lateral movement is fully achieved by the rolling friction of the rolling element 103 to the rail 102, friction between the spur gear 106 and the rack gear 105, and a driving force against the inertial force of the top 12. When the operating force is excessive, a mechanism for reducing the operating force is preferably provided by the decelerator or the like.

Figure 7:
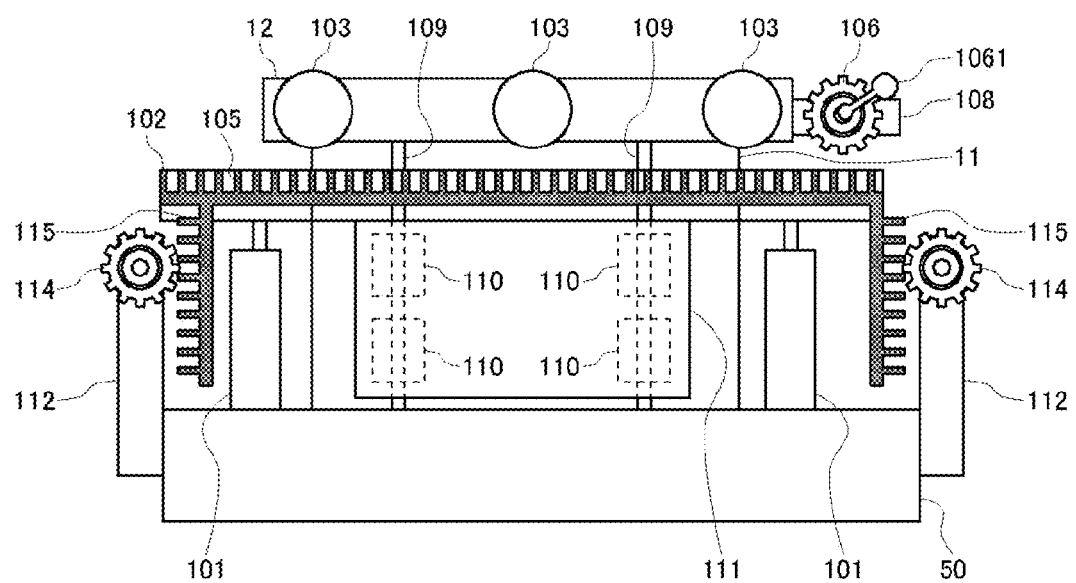
FIG. 7 is a diagram illustrating operation of a horizontal position maintaining mechanism according to the first embodiment.
Figure 8:
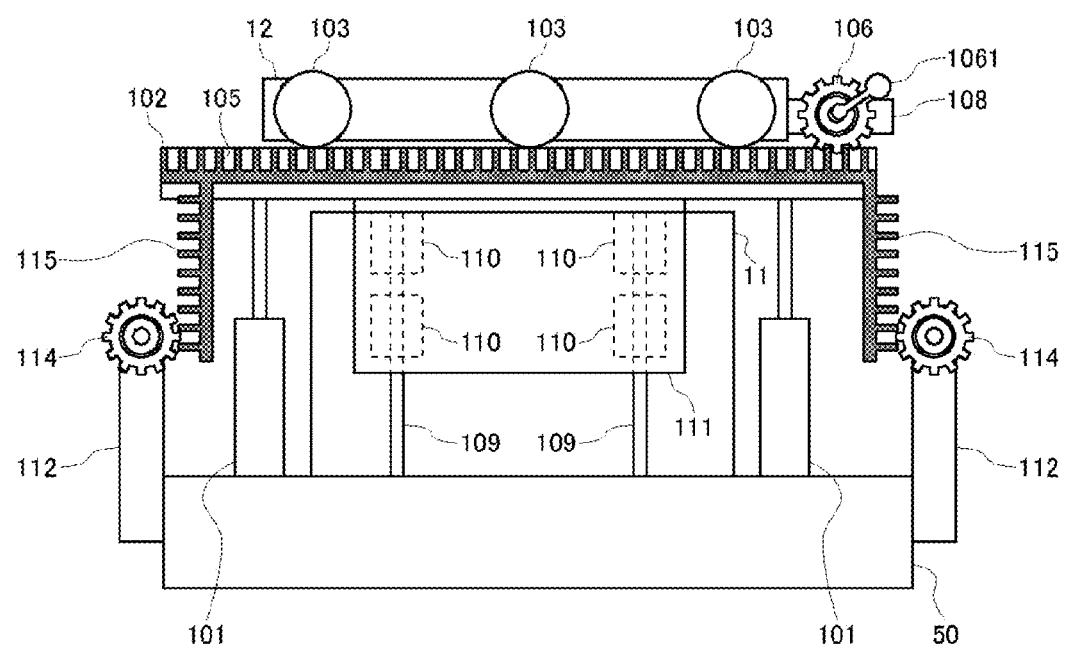
FIG. 8 is a diagram illustrating the operation of the horizontal position maintaining mechanism according to the first embodiment.

Next, operation of the horizontal position maintaining mechanism will be described. FIGS. 7 and 8 are diagrams illustrating the operation of the horizontal position maintaining mechanism. It is note that, also in FIGS. 7 and 8, only elements required for description of the horizontal position maintaining mechanism are illustrated, and the other elements are not illustrated. When the end of any of the jacks 101 is raised higher and the top 12 is inclined, while the rails 102 configured to support the top 12 are lifted by the four jacks 101, a large load is applied to the other jacks 101 other than the jack 101 having the raised end, and a load on the jack 101 having the raised end is reduced. As described above, since the four jacks 101 are driven by the same hydraulic source, the oil pressure is concentrated to the jack 101 having the reduced load, and the jack 101 is raised much higher. Accordingly, the inclination of the top 12 is increased. The horizontal position maintaining mechanism for a right-left direction and the horizontal position maintaining mechanism for a backward direction are provided in order to prevent such inclination of the top 12.

First, operation of the horizontal position maintaining mechanism for a right-left direction will be described. As described above, the horizontal position maintaining mechanism for a right-left direction includes the linear guide rails 109, the guide blocks 110, and the connection plate 111, and is used for preventing the inclination of the top 12 which is caused by the backward axial rotation. The guide blocks 110 are driven to be lifted up along the guide rails 109 to prevent the inclination of the top 12 which is caused by the backward axial rotation. That is, a driving force for supporting and lifting the rails 102 configured to support the top 12 is provided by the jacks 101, but the guide blocks 110 provides the rail 102 a horizontal position maintaining force while up and down movement through the connection plate 111 to adjust the position of the top 12.

Next, operation of the horizontal position maintaining mechanism for a backward direction will be described. As described above, the horizontal position maintaining mechanism for a backward direction includes the shaft holders 112, the shafts 113, the spur gears 114, and the rack gears 115, and is used for preventing the inclination of the top 12 which is caused by right-left axial rotation. When the rail 102 is lifted up by the jacks 101, the rack gears 115 engaged with the spur gears 114 are also lifted up with the rail 102. Any of the spur gears 114 on the front and the back sides is fixed to the shaft 113, so that the rotation of the two spur gears 114 with the lifting of the rack gears 115 are synchronized with each other, and consequently the rack gears 115 is also synchronously lifted up. By this configuration, the rail 102 on the front side and the rail 102 on the back side are lifted synchronously, and inclination of the top 12 which is caused by the right-left axial rotation is prevented. It is noted that this configuration may be changed to the horizontal position maintaining mechanism for a right-left direction by extending the shaft 113 outward to be provided with toothed pulleys for a belt similar to the spur gear 114, and mounting a timing belt around the right and left pulleys.

Theoretically, it is possible that the four jacks 101 are driven and controlled, respectively, to lift up the top 12 while being maintained in the horizontal position. However, it is necessary to prepare four hydraulic sources in total for respective jacks 101, or it is necessary, for example, to control a valve on a hydraulic line when the hydraulic sources are integrated. In addition, it is difficult to achieve a configuration for finely adjusting the height of jack 101 by the hydraulic source. Therefore, it is advantageous to maintain the horizontal position of the top 12 by the horizontal position maintaining mechanism for a right-left direction and the horizontal position maintaining mechanism for a backward direction which are provided separate from the jacks 101, as in the present embodiment.

These are the opening operation for removing the top 12 from the container body 11 and putting the top 12 on the top resting table 104. When the top 12 is returned to the container body 11 after for example repairing or maintaining of the inside of the container 10, the closing operation is performed which is the reverse of the opening operation having been described above. That is, the rotating handle 1061 is turned to rotate the spur gear 106, the top 12 put on the top resting table 104 is driven toward the container 10, the top 12 is moved to the rail 102 until the top 12 reaches immediately above the container body 11, the jack 101 is lowered to lower the rail 102, and thereby the top 12 covers the container body 11. It is noted that a positioning unit obtained by combining a pin and a hole, a pin and a protruding surface, or the like may be provided at a contact point between the top 12 and the container body 11 to accurately position the top 12 to the container body 11.

Figure 9:
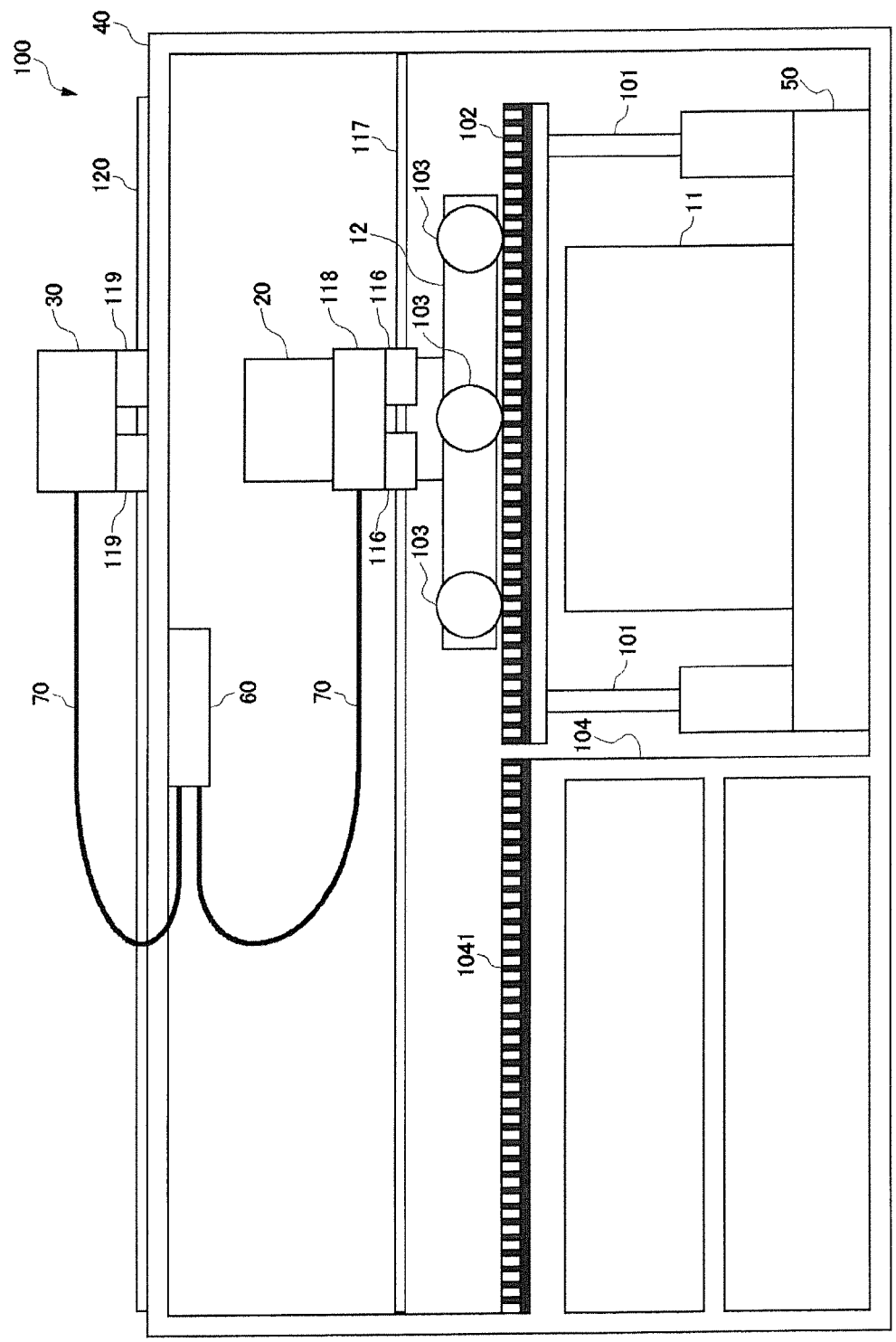
FIG. 9 is a diagram illustrating operation of the column movement supporting mechanism and an accessory device moving mechanism according to the first embodiment.
Figure 10:
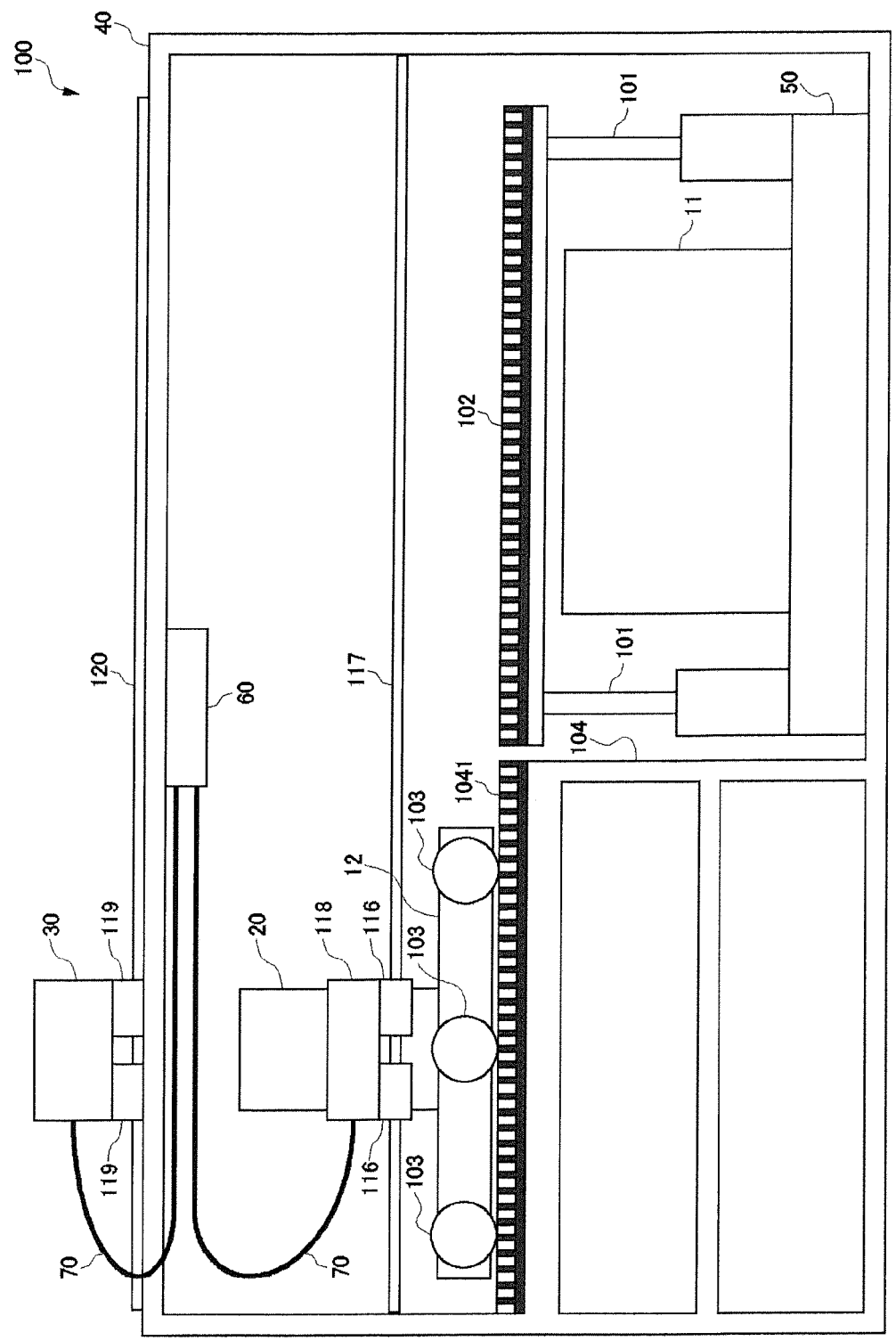
FIG. 10 is a diagram illustrating the operation of the column movement supporting mechanism and the accessory device moving mechanism according to the first embodiment.

Next, description will be made of operation of the column movement supporting mechanism and operation of the accessory device moving mechanism. FIGS. 9 and 10 are diagrams illustrating the column movement supporting mechanism and the accessory device moving mechanism. It is note that, also in FIGS. 9 and 10, elements not required for description of the operation of the column movement supporting mechanism and the operation of the accessory device moving mechanism are not illustrated.

When the top 12 is moved to the top resting table 104 as illustrated in FIG. 10, after the top 12 is lifted as illustrated in FIG. 9, the connection housing 118 configured to connect the wire and the pipe to the column 20 on the top 12 is moved with the column 20 and the top 12 by sliding of the guide blocks 116 on the rail 117 with the lateral movement of the top 12. In this configuration, the storage box 60 is fixed to the housing 40, so that the storage box 60 is not moved during the lateral movement of the column 20. The wire and the pipe connecting the connection housing 118 and the storage box 60 is housed in flexible Cableveyor 70, so that Cableveyor 70 connecting the connection housing 118 and the storage box 60 is deformed with the movement of the connection housing 118, and thus the wire and the pipe follow the movement of the connection housing 118. It is noted that the connection housing 118 is mounted to have a minute space between itself and the structure on the top or the column in a right-left direction, before the top 12 is laterally moved. When the top is moved, the space is eliminated for connection, and the connection housing 118 is moved with the top 12 and the column 20.

In this configuration, the guide blocks 119 fixed to the accessory device 30 are slid on the rail 120, in synchronization with the lateral movement of the column 20 and the top 12, and thereby, the accessory device 30 is laterally moved in synchronization with the lateral movement of the column 20 and the top 12. The wire and the pipe connecting the accessory device 30 and the storage box 60 are housed in flexible Cableveyor 70, so that Cableveyor 70 connecting the accessory device 30 and the storage box 60 is deformed with the movement of the accessory device 30, and the wire and the pipe follow the movement of the accessory device 30.

Owing to such operation of the column movement supporting mechanism and the accessory device moving mechanism, even when the top 12 mounted with the column 20 is removed from the container body 11 and moved to the top resting table 104, disconnection between the column 20 and the wire and the pipe is not required, and thus opening-closing operation of the top 12 can be smoothly performed. In addition, collection of the wire and the pipe by flexible Cableveyor 70 does not make the wire and the pipe complicated, even when the column 20 or the accessory device 30 is laterally moved.

As described above, according to the top opening-closing mechanism of the embodiment having been described above, since the top 12 is laterally moved, the upper surface of the container 10 is fully opened, and access to the inside of the container 10 is facilitated for repair, maintenance, or the like. Further, owing to the rotatable rolling element 103 provided on the side surface of the top 12, the rail 102 may only be jacked up, in order to move the top 12 laterally, supporting the rolling element 103 from below to lift the top 12 from the container body 11. Therefore, the upper surface of the container 10 can be opened without complicated operation.

Further, the inspection apparatus 100 according to the embodiment having been described above, includes the lateral movement mechanism including the rack gears 105 jacked up with the rails 102, the rack gears 1042 provided along the rails 1041 provided at the top resting table 104, and the spur gears 106 rotatably supported at the top 12, and in the lateral movement mechanism, when the top 12 is lifted up from the container body 11, the spur gear 106 meshes with the rack gear 105, and the spur gear 106 is rotated to facilitate the lateral movement of the top 12.

The inspection apparatus 100 according to the embodiment having been described above includes the horizontal position maintaining mechanism including the linear guide rails 109, the guide blocks 110, the connection plate 111, the shaft holders 112, the shafts 113, the spur gears 114, and the rack gears 115. Therefore, the top 12 can be lifted above the container body 11 while being maintained in the horizontal position, and disadvantageous concentration of pressure on any of the four jacks 101 by the inclination of the top 12 can be prevented.

Figure 11:
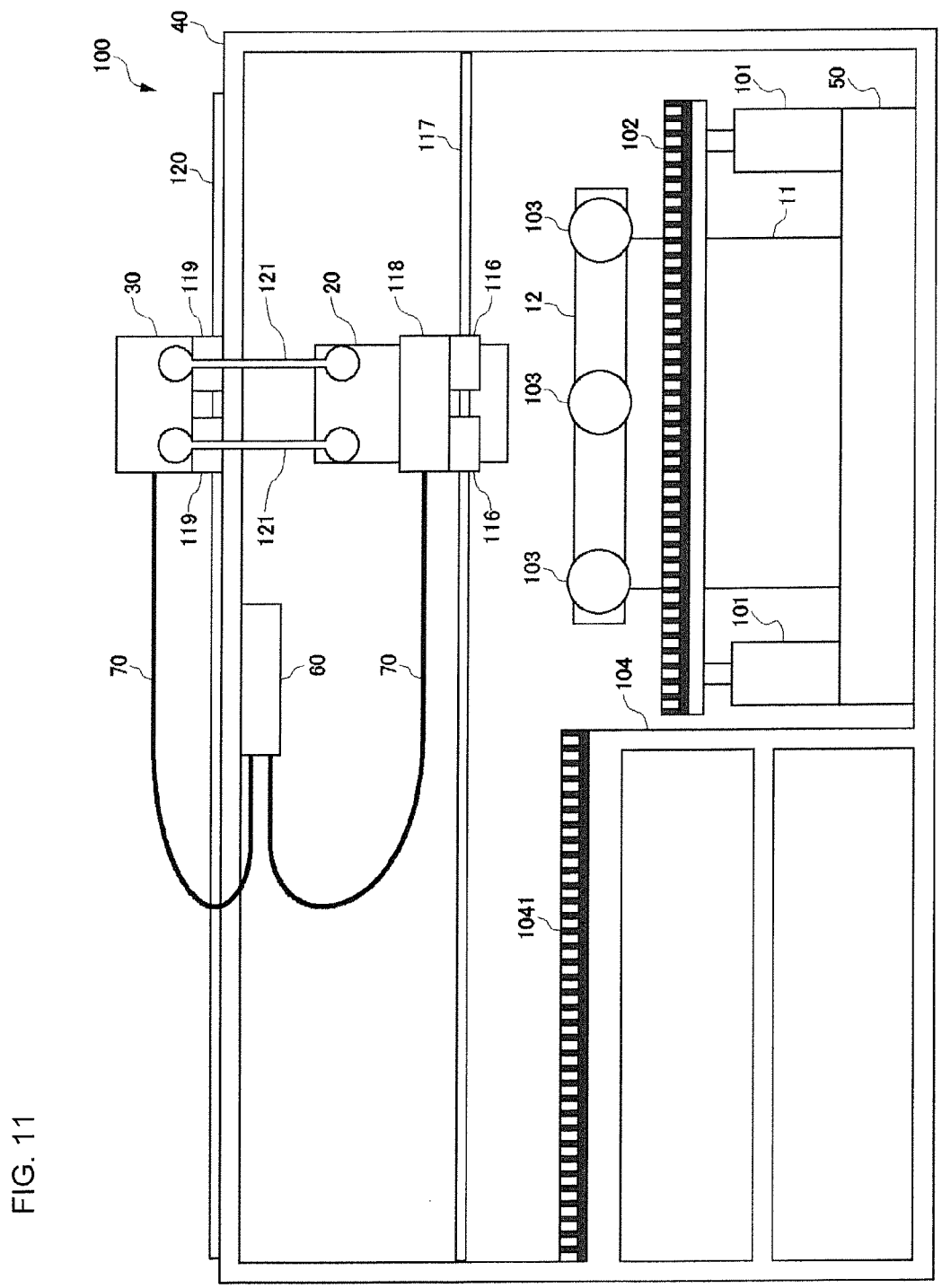
FIG. 11 is a side view illustrating a main configuration of the inspection apparatus according to a modification of the first embodiment.
Figure 12:
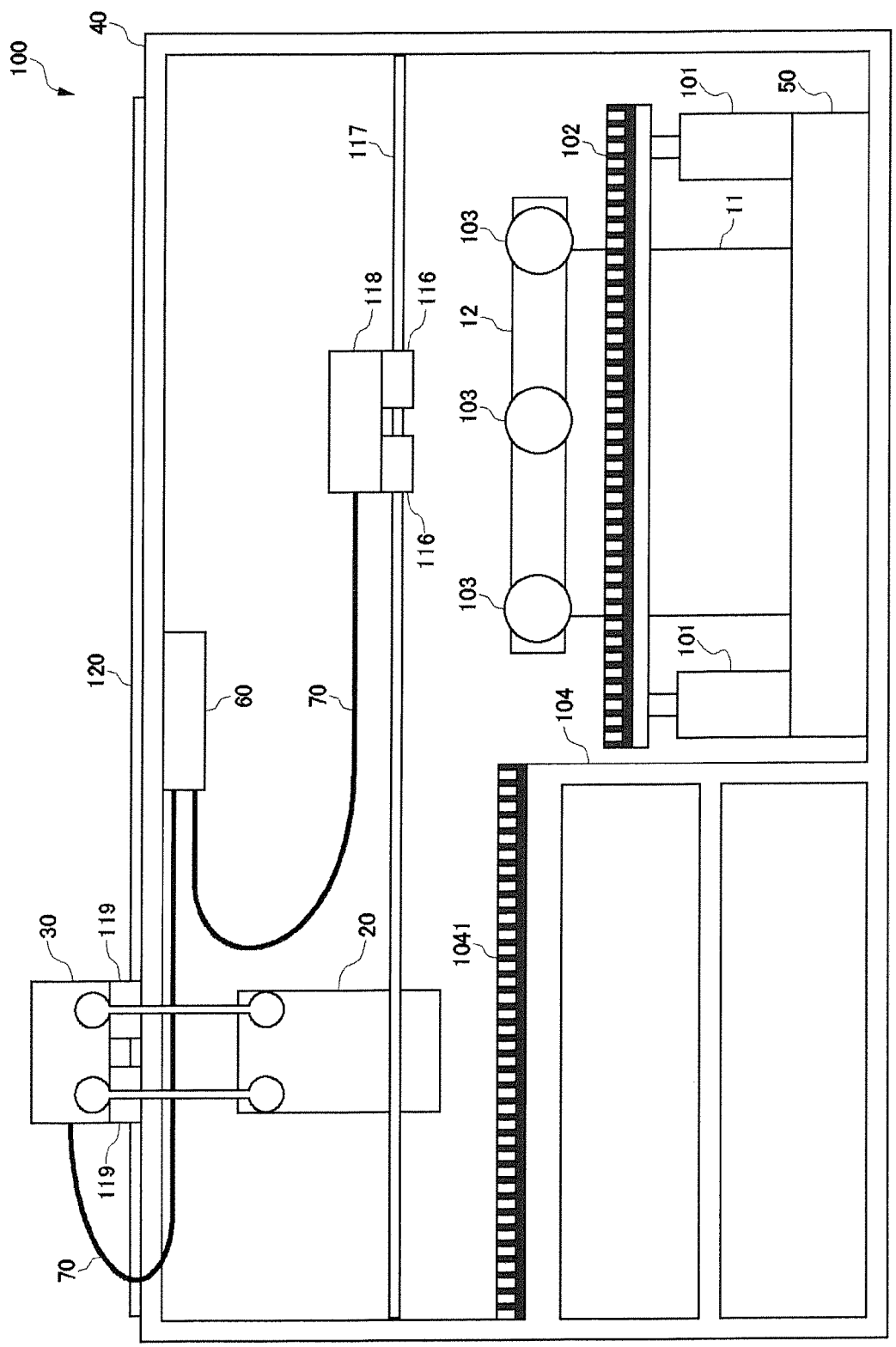
FIG. 12 is a side view illustrating the main configuration of the inspection apparatus according to the modification of the first embodiment.

Modifications of the embodiment having been described above will be described below. FIGS. 11 and 12 are side views illustrating a main configuration of the inspection apparatus according to a modification. In the present modification, the column 20 is suspended by a suspending member 121. The suspending member 121 has a lower end fixed to the column 20, and an upper end fixed to the accessory device 30. The column 20 can be moved laterally with the accessory device 30. In this configuration, as illustrated in FIG. 12, the column 20 is moved laterally separated from the connection housing 118 and the guide block 116 supporting the connection housing 118.

Owing to such a configuration, the accessory device 30 and the column 20 may be moved laterally in synchronization with each other and separated from the top 12. As described in the embodiment, the column 20 mounted on the top 12 has a heavyweight, and a large driving force is required to move the top 12 when the column 20 is moved integrally with the top 12. However, according to the present modification, the column 20 can be moved separately from the top 12, and thus, repairing or maintenance of the column 20 is facilitated. In the present modification, it is preferably configured such that when the top 12 is lifted up and moved laterally, the connection housing 118 and the guide block 116 are moved laterally with the top 12, the top 12 is removed to open the upper surface of the container body 11, and access to the upper surface of the container body 11 is facilitated.

Further, in the embodiment having been described above, the configuration including the linear guide rail 109, the guide block 110, and the connection plate 111 is employed as the horizontal position maintaining mechanism for a right-left direction, but a configuration similar to this configuration may be provided on a side surface of the container body to have the horizontal position maintaining mechanism for a backward direction. In this case, the rails 102 on the front and back sides are connected to each other, and to this connected portion, the connection plate 111 extending backward is fixed. Then, the connection plate 111 is fixed with the guide blocks spaced apart in the backward direction, and provided with the guide rails for vertically guiding the guide blocks, on the side surface of the container body 11.

Further, in the embodiment having been described above, the configuration including the shaft holder 112, the shaft 113, the spur gear 114, and the rack gear 115 is employed as the horizontal position maintaining mechanism for a backward direction, but a configuration similar to this configuration may be provided on the front surface and/or the back surface to have the horizontal position maintaining mechanism for a right-left direction. In this configuration, the shaft holder 112 is fixed on the front surface and/or the back surface of the top 12, the shaft holder 112 rotatably supports the shaft 113 having both ends fixed with the spur gears 114, and the rail 102 is provided with the rack gears 115 extending upward and downward, and meshing with the spur gears 114.

Further, in the embodiment having been described above, the horizontal position maintaining mechanism for a backward direction is provided on both right and left sides of the container 10, or on both front and back sides in a direction in which the top 12 having been lifted is moved, but the horizontal position maintaining mechanism for a backward direction may be provided on only either side. Since the top resting table 104 is specifically provided on the front side in a direction in which the top 12 having been lifted is moved, when there is no sufficient space, the horizontal position maintaining mechanism for a backward direction on the top resting table 104 side may be omitted.

Further, in the embodiment having been described above, the hydraulic jack 101 is employed as the configuration for lifting up the rail 102, but a driving device or a driving mechanism other than the hydraulic jack 101 may be employed. Further, in the embodiment, an example has been described in which the top opening-closing mechanism is applied as the mechanism for opening and closing the top of the vacuum container configured to house a stage of the inspection apparatus, but the top opening-closing mechanism can be also applied as a mechanism for opening and closing a top of a container other than the vacuum container.

Further, in the embodiment having been described above, the container body 11 and the top 12 have the same size in a planar view, and the rolling elements 103 are provided on the outside (front side and back side) of the top 12 so that the rolling elements 103 are positioned on the outside (front side and back side) of the container body 11, but when the top 12 has a size larger than that of the container body 11 in a planar view, the rolling elements 103 are preferably positioned on the outside of the container body 11 in a planar view, and do not always need to be provided on the outside of the top 12.

Figure 13:
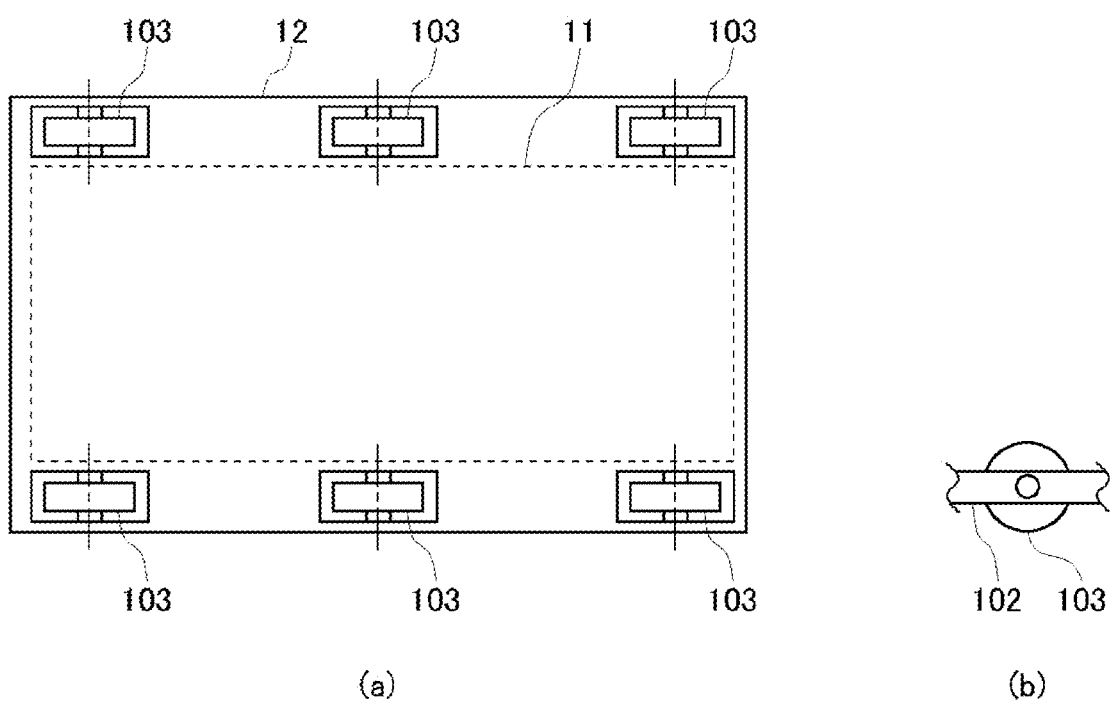
FIG. 13A is a schematic plan view illustrating a configuration of the top according to a modification of the first embodiment.
FIG. 13B is a side view illustrating the rolling element of the top according to the modification of the first embodiment.

FIG. 13A is a schematic plan view illustrating a configuration of the top according to a modification, and FIG. 13B is a side view illustrating one rolling element 103. The top 12 has a size larger than that of the container body 11, and the front and back sides of the top 12 are positioned outward from the container body 11 in a planar view. The rolling elements 103 are each provided in a hole formed in a portion in which the top 12 is protruded from the container body 11. The rolling element 103 is rotatably supported on both front and back sides of the top 12. As described above, as far as the rolling element 103 is positioned on the outside of the container body 11 in a planar view, the top 12 can be lifted up from the container body 11 by taking up such a rolling element 103 from below by the rail 102.

Industrial Applicability

According to the present embodiment, when the top is opened, the rolling element provided at the top is lifted up from below to lift up the top from the container body. Accordingly, the operation of lifting the top from the container body and the operation of laterally moving the top having been lifted can be continuously performed, and the top of the container can be readily opened effectively. The present embodiment is useful as the opening-closing mechanism for a top (upper plate) of a container used for a semiconductor producing apparatus for processing an object, an inspection apparatus for inspecting an object, or the like.

<Second Embodiment: Reflecting Mirror Supporting Structure of Laser Interferometer>

(Field)

The present embodiment relates to a reflecting mirror supporting structure of a laser interferometer (hereinafter also referred to as "length measuring machine") for measuring the position or moving rate of an object to be measured based on laser beam emitted to a reflecting mirror mounted to the object to be measured, and reflected beams reflected from the reflecting mirror.

(Background)

A semiconductor producing apparatus for processing a material, an inspection apparatus for inspecting a sample, or the like is mounted with a stage configured to hold the material or the sample to be processed or inspected, and move the material or the sample to an arbitrary position. The stage generally has an uppermost part provided with a table including a holding unit, such as an electrostatic chuck, configured to hold the material or the sample, a reflecting mirror of the laser interferometer for measuring the position of the table is mounted on the table, and the material or the sample held on the table is highly precisely controlled and displaced at a desired moving rate or moving speed by feedback control of a stage driving source using a measured length value detected by the length measuring device.

Figure 21:
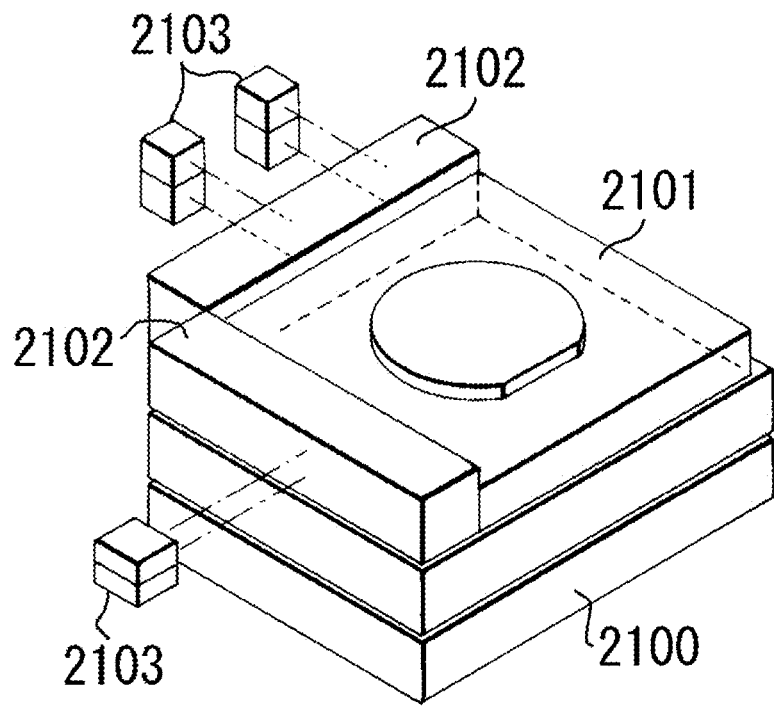
FIG. 21 is a diagram illustrating a conventional configuration in which a table is mounted with reflecting mirrors.

Generally, in order to hold the reflecting mirror on such a table provided at the uppermost part of the stage, for example as illustrated in FIG. 21, a table 2101 is provided at the uppermost part of a stage 2100, the table 2101 itself is formed with a seat surface or positioning structure for a reflecting mirror 2102, and the reflecting mirror 2102 is directly fixed and held on the table 2101. In FIG. 21, a reference sign 2103 denotes the length measuring device emitting laser beam to the reflecting mirror 2102 and receiving reflected beams from the reflecting mirror 2102 (e.g., see JP 05-315221 A).

Further, the orientation adjustment (alignment) of the reflecting mirror has been performed by bringing a steel adjusting component, such as a screw, a fixing pin, or a leaf spring, into direct contact with the reflecting mirror, and appropriately changing the contact pressure, penetration depth, or the like of the adjusting component with respect to the reflecting mirror.

(Summary)

In an electron beam apparatus for processing or inspection using charged particle radiation, such as an electron beam or an ion beam, of the semiconductor producing apparatus or the inspection apparatus, measurement of the length of the table holding the material or the like thereon is required to obtain a value to a level equal to or less than several nanometers ($10^{-9}$ m or less) as a material to be processed is miniaturized. Accordingly, the reflecting mirror as a reference for measuring the length of the table needs to be mounted on the table accurately and precisely in orientation. Therefore, the reflecting mirror needs to be adjusted accurately and precisely in orientation, and it is desirable that the reflecting mirror is not displaced from the adjusted orientation due to temporal change after adjustment.

However, the reflecting mirror directly fixed and held on the upper surface of the table of the stage, as described above, brings about the following problems.

The reflecting mirror is generally obtained by forming a mirror surface on a surface of a low thermal expansion material, such as fused silica, through aluminum deposition, and finished considerably highly precisely in flatness, linearity, and squareness. The manufacturing accuracy is secured as long as the reflecting mirror is in a so-called free state, or does not have anything on the surface. When the reflecting mirror is directly fixed and held on the table of the stage, the reflecting mirror is secured by being strongly pressed against and tightly fastened to the table for mounting rigidity, so that a pressing force or fastening force is concentrically applied to the held point of the reflecting mirror. Therefore, the reflecting mirror is locally deformed, for example warp or twist of the mirror surface, and manufacturing accuracy may be deteriorated.

In addition, the reflecting mirror is also adjusted in orientation by for example strongly pressing an adjusting bolt to increase a holding force at a holding point, after a orientation at which the table holds the reflecting mirror is delicately adjusted. Therefore, even if the orientation of the reflecting mirror is accurately adjusted during adjustment, an external force is concentrically applied to the held point due to fixing operation after adjustment, and the orientation of the reflecting mirror may be deviated or reflecting mirror may be deformed.

Further, in a mode of directly fixing and holding the reflecting mirror on the table of the stage, the reflecting mirror is directly influenced by deformation of the table itself during movement of the table on the stage, deterioration of a table surface due to temporal change, or the like, at a contact portion between the table and the reflecting mirror. Consequently, the reflecting mirror deforms by itself or a portion of a mounting orientation is displaced, and accuracy and precision in orientation or the shape of the mirror surface may not be maintained.

Deformation of the reflecting mirror or inaccurate orientation of the reflecting mirror leads to an inaccurate measurement result, and the material or the like held on the table cannot be moved accurately and precisely to a target position on the stage.

The present embodiment has been made in view of such problems of the related art, and an object of the present embodiment is to increase detection accuracy of a measured length value of a length measuring device by preventing local deformation of a reflecting mirror which is generated when the reflecting mirror is fixed and held on a table or the like, and stably holding the reflecting mirror while maintaining initial manufacturing accuracy.

In order to solve the problems, the present embodiment provides a reflecting mirror supporting structure of a laser interferometer configured to emit a laser beam toward the reflecting mirror mounted on an object to be measured and measuring the position of the object to be measured. In the reflecting mirror supporting structure, a reflecting mirror holder has a recessed portion including a seat surface for mounting the reflecting mirror thereon, and is fixed to the object to be measured. The reflecting mirror is mounted on the seat surface of the reflecting mirror holder. At least one of a lower surface portion and a front surface portion or a back surface portion of the reflecting mirror is supported in the recessed portion. A retaining plate having one side including an elastic body is disposed so that the elastic body faces the front surface portion or the back surface portion of the reflecting mirror having been mounted on the seat surface. The elastic body is pressed against the front surface portion or the back surface portion of the reflecting mirror, and the elastic body is elastically urged toward a surface opposite to the surface against which the elastic body has been pressed. In such a condition, the reflecting mirror is held by the reflecting mirror holder, and the laser beam is emitted from the laser interferometer to the front surface portion of the reflecting mirror.

According to this configuration, the reflecting mirror is held by the reflecting mirror holder fixed to the object to be measured without being directly fixed to and held on the object to be measured, such as the table, so that the reflecting mirror is not directly subjected to the influence of temporal change, or deformation of the object to be measured itself which is caused upon displacement of the object to be measured, for example, movement of the table on the stage. Further, the elastic body on the retaining plate is pressed against a surface of the reflecting mirror, the reflecting mirror is elastically urged toward the surface opposite to the surface against which the elastic body is pressed, and the reflecting mirror is held by the reflecting mirror holder. Therefore, local concentration of the external force on the reflecting mirror is prevented, influence of local deformation on the reflecting mirror is minimized compared with the conventional reflecting mirror held by the metal component such as the adjusting bolt, and mirror accuracy of the reflecting mirror is maintained at an initial manufacturing accuracy.

Further, a vibration frequency characteristic or aperiodic damping specific to a metal material of a conventional metal component (natural frequency band of reflecting mirror holder is narrow and difficult to attenuate) is improved by holding the reflecting mirror through the elastic body, and consequently, controllability of the stage to be controlled is improved, considerably minute vibration which generates the temporal change of the reflecting mirror holder for a longtime is also reduced, and an initial holding condition can be maintained for a long time, for example, for a period of approximately ten years corresponding to a design lifetime of a general apparatus.

Use of the elastic body provides a moderate pressing force and a corresponding moderate frictional force at a contact surface which the metal component does not have, and a moderate holding force can be obtained not only in a pressing direction but also any direction.

In the reflecting mirror supporting structure of the laser interferometer having the above-mentioned configuration, the reflecting mirror holder preferably includes a orientation adjustment unit configured to change a holding orientation of the reflecting mirror.

According to this configuration, the reflecting mirror is mounted in the following sequence. First, the reflecting mirror is held by the reflecting mirror holder. Next, the holding orientation of the reflecting mirror to the object to be measured in the reflecting mirror holder is adjusted by the orientation adjustment unit. Then, the reflecting mirror holder is fixed to the object to be measured. After the holding orientation of the reflecting mirror is adjusted, and the reflecting mirror holder is fixed to the object to be measured. Therefore, adjustment of orientation does not deform the reflecting mirror, the adjustment is facilitated, and the holding force (holding rigidity) for the reflecting mirror after adjustment can be also secured. The orientation of the reflecting mirror is adjusted by appropriately changing the mounting position of the reflecting mirror holder to the object to be measured by the orientation adjustment unit, and the orientation of the reflecting mirror is prevented from being changed by the influence of the deformation of the object to be measured itself or temporal change, and is maintained in the orientation having been adjusted.

In the reflecting mirror supporting structure of the laser interferometer having the above-mentioned configuration, it is preferable that the elastic body mounted to the retaining plate and elastically urging the surface of the reflecting mirror includes an O-ring shape, or annular shape, and the retaining plates is provided with a portion for holding the elastic body, such as a recessed groove.

With the use of the O-ring as the elastic body, an elastic urging unit can be configured readily and inexpensively. Preferably, the O-ring includes corrosion-resistant and heat-resistant fluororubber or the like in addition to nitrile rubber. The elastic body may include a similar rubber material or a synthetic resin material having a good corrosion-resistance and heat-resistance.

A portion for holding the elastic body, provided at the retaining plate, may have a shape of generally so-called O-ring groove. Generally, the O-ring groove has a size formed assuming sealing of an arbitrary gas, liquid, or fluid, and the O-ring has a compression rate (so-called squeeze rate or the like) at a sealing (pressing) surface of approximately 8 to 30%, but, in the present embodiment, the compression rate of the O-ring for holding the reflecting mirror, is preferably approximately 10 to 20% in order to obtain an optimal pressing force, frictional force, and vibration characteristic.

Further, when a hole portion for exhausting air between the elastic body and the reflecting mirror is provided in the retaining plate, air in the inner space of the elastic body is exhausted through the hole portion in the retaining plate upon mounting the reflecting mirror in a vacuum environment such as a vacuum container, and trapped air obstructing vacuum performance is preferably eliminated.

Further, in the reflecting mirror supporting structure of the laser interferometer having the above-mentioned configuration, the front surface portion or the back surface portion of the reflecting mirror is elastically urged by the elastic body of the retaining plate toward a surface opposite to the surface against which the elastic body has been pressed, and in addition to that, as a mode of holding the reflecting mirror by the reflecting mirror holder, an elastic urging unit for the reflecting mirror is provided at least on one side surface portion of both side surface portions of the reflecting mirror, to elastically urge the reflecting mirror toward a side surface portion on the other side through the elastic body, and the holding rigidity of the reflecting mirror can be increased. An elastic urging unit may be provided on both side surface portions of the reflecting mirror to elastically urge the reflecting mirror mutually on both side surface portions, toward the respective other side surface portions through the elastic body.

Further in order to increase the holding rigidity of the reflecting mirror, an elastic urging unit may be provided on an upper surface portion of the reflecting mirror, to elastically urge the reflecting mirror downward through the elastic body.

According to the present embodiment, the reflecting mirror is configured to be held at the object to be measured through the reflecting mirror holder. Therefore, the reflecting mirror is not directly subjected to the influence of temporal change, or the deformation of the object to be measured itself. Further since the reflecting mirror is held by pressing the surface of the reflecting mirror through the elastic body provided at the retaining plate, the moderate pressing force and the corresponding moderate frictional force at the contact surface can be obtained, the moderate holding force can be obtained not only in the pressing direction but also any direction, the local deformation of the reflecting mirror is prevented, the reflecting mirror can be stably held while maintaining the initial manufacturing accuracy, and the detection accuracy of the measured length value of the length measuring device can be increased.

Specific Configuration

Figure 14:
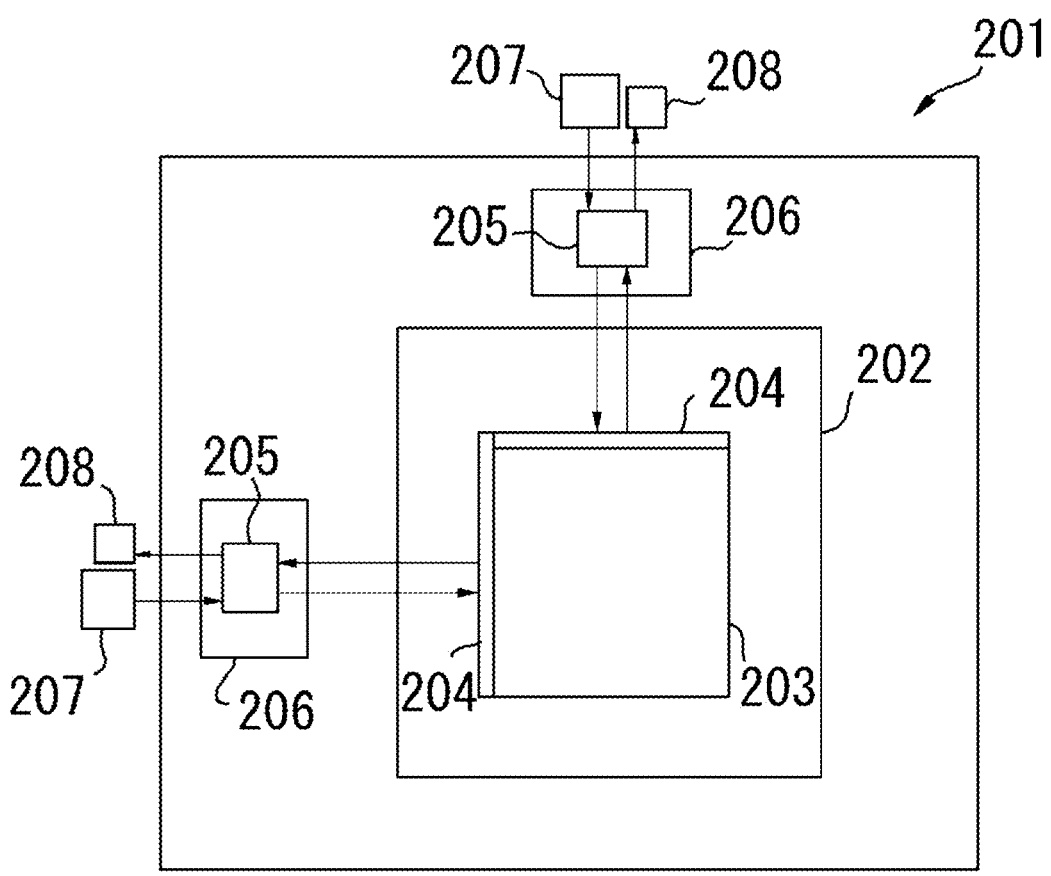
FIG. 14 is a diagram illustrating a configuration in a vacuum container where a second embodiment is applied to a stage length measurement system in the vacuum container.

One preferable embodiment of the present embodiment will be described based on the drawings. FIG. 14 is a diagram illustrating a configuration in the vacuum container where the present embodiment is applied to a stage length measurement system mounted in the vacuum container of an electron beam apparatus. In FIG. 14, a reference sign 201 denotes the vacuum container, 202 denotes the stage, 203 denotes the table mounted to an uppermost part of the stage, 204 denotes the reflecting mirrors held on the table 203 across one corner portion of the table 203, 205 denotes the laser interferometers mounted on mounts 206, 207 denotes an optical axis adjusting device, and 208 denotes a pickup.

In FIG. 14, the table 203 is configured such that a material, a sample, or the like put on the upper surface thereof is held by a holding unit such as an electrostatic chuck, and mounted so as to be slidably moved on the stage 202 by a stage driving source not illustrated, a laser beam is emitted from the length measuring device 205 to a front surface portion 204a of the reflecting mirror 204 held on the table 203 through the optical axis adjusting device 207, a reflected beam reflected from the front surface portion 204a of the reflecting mirror 204 is received by the length measuring device 205, the reflected beam is further input to the pickup 208, the position or the moving rate of the table 203 is detected based on the emitted beam and the reflected beam, the table 203 is highly precisely controlled at a desired moving rate or moving speed by feedback control of the stage driving source using a detected measured length value, and, the material or the sample held on the upper surface can be displaced to a desired position.

Figure 15:
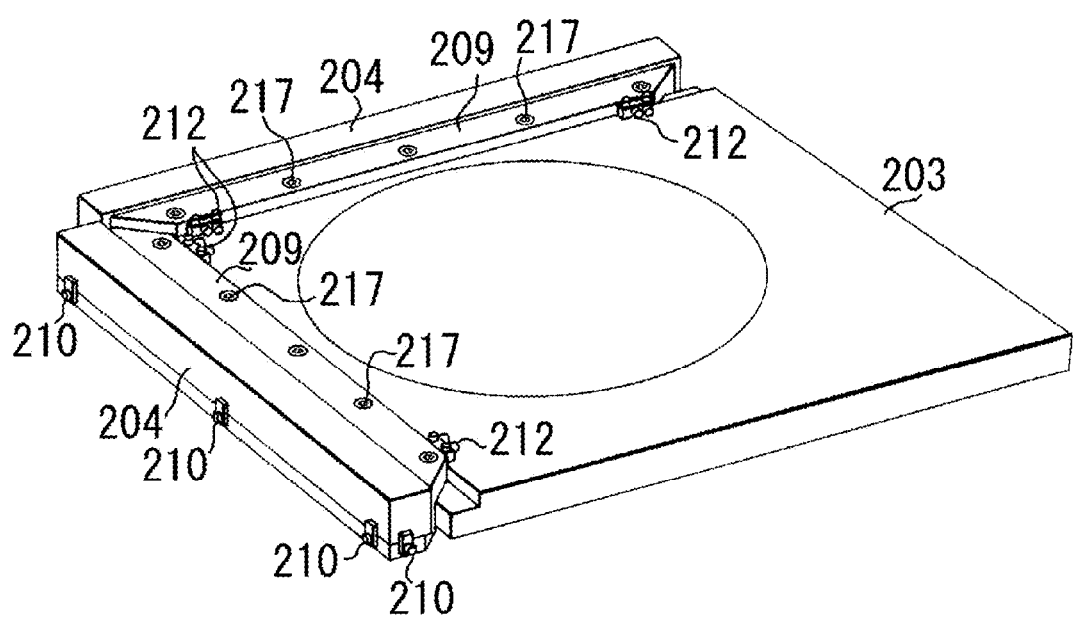
FIG. 15 is an appearance view illustrating a table holding a reflecting mirror according to the second embodiment.

FIG. 15 is a diagram illustrating the appearance of the table 203 holding the reflecting mirrors 204. As illustrated in FIG. 15, reflecting mirror holders 209 are mounted on adjacent two sides across one corner portion of on the table 203 having a substantially square shape in a planar view, each of the reflecting mirror 204 is housed in a recessed portion 209b provided on the outside of reflecting mirror holder 209, a surface of the reflecting mirror is elastically urged by a plurality of retaining plates 210 each including an O-ring 211, and held on the reflecting mirror holder 209.

Specifically, the reflecting mirror 204 is obtained by forming a mirror surface on a surface of a low thermal expansion material through aluminum deposition, and is finished highly precisely in flatness, linearity, and squareness. The reflecting mirror 204 is formed into a rectangular columnar shape having a substantially square cross-section.

Figure 16:
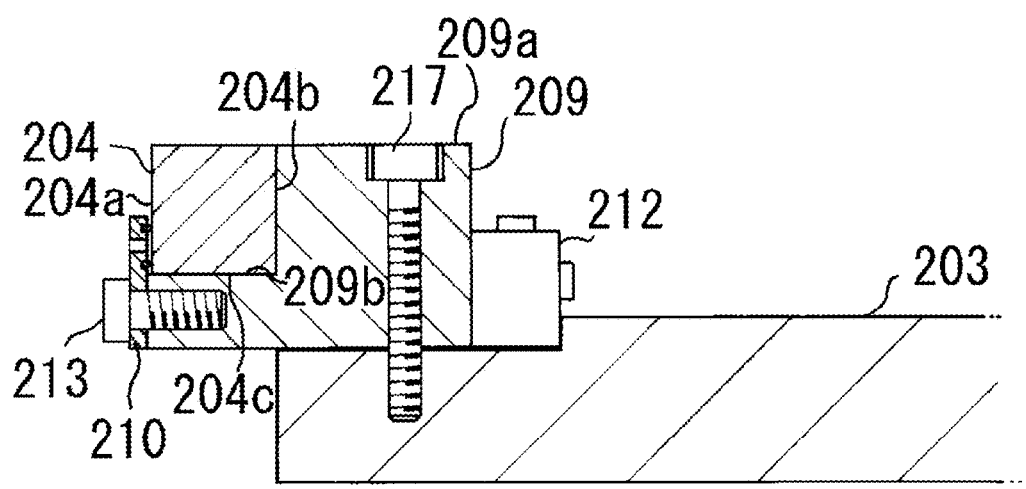
FIG. 16 is a fragmentary cross-sectional view illustrating a main part of the table and the reflecting mirror of FIG. 15.

As illustrated in FIGS. 15 and 16, the reflecting mirror holder 209 has an inside having a mounting portion 209a fixed on an upper surface of the table 203, and an outside having the recessed portion 209b including the seat surface for mounting the reflecting mirror 204 thereon, and thus the reflecting mirror holder is formed to be attachable to and detachable from the table 203. The reflecting mirror 204 mounted on the seat surface in the recessed portion 209b is provided so that a back surface portion 204b and a lower surface portion 204c of the reflecting mirror 204 are supported on the surface of the recessed portion 209b, and the reflecting mirror can be held on the seat surface of the recessed portion 209b. In addition, as described below, both ends of a side part of the mounting portion 209a of the reflecting mirror holder 209 are provided with orientation adjustment units 212 each configured to adjust a holding orientation (holding angle) of the reflecting mirror 204 held on the seat surface of the recessed portion 209b with respect to the table 203.

Figure 17:
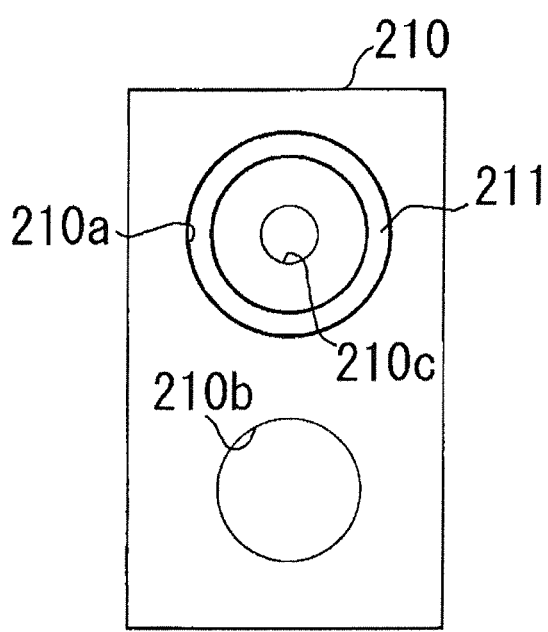
FIG. 17A is a front view of a retaining plate of FIG. 15.
FIG. 17B is a longitudinal cross-sectional view of the retaining plate of FIG. 15.
Figure 17:
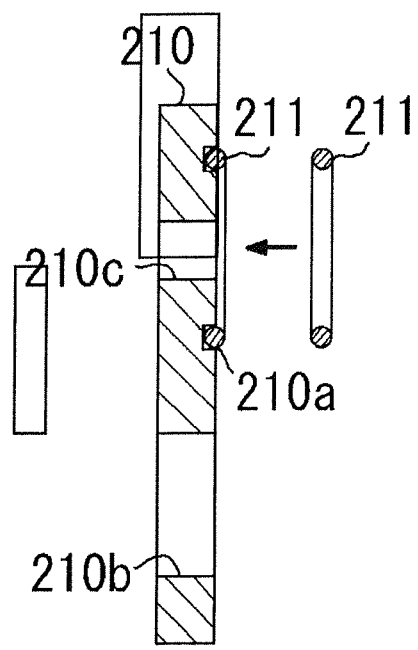

The retaining plate 210 includes a thin-walled steel strip. As illustrated in FIGS. 17A and 17B, the thin-walled steel strip has an upper half portion, the upper half portion has a surface formed with a ring-shaped recessed groove 210a therein, and the O-ring 211 as the elastic body is mounted and held in the ring-shaped recessed groove 210a. The thin-walled steel strip has a lower half portion, the lower surface portion has a surface formed with a hole portion 210b for receiving the insertion of a retaining screw 213 therein, and, an exhausting hole portion 210c leading to a center opening of the O-ring 211 is formed at the center of the recessed groove 210a in the surface of the upper half portion including the O-ring 211.

Figure 18:
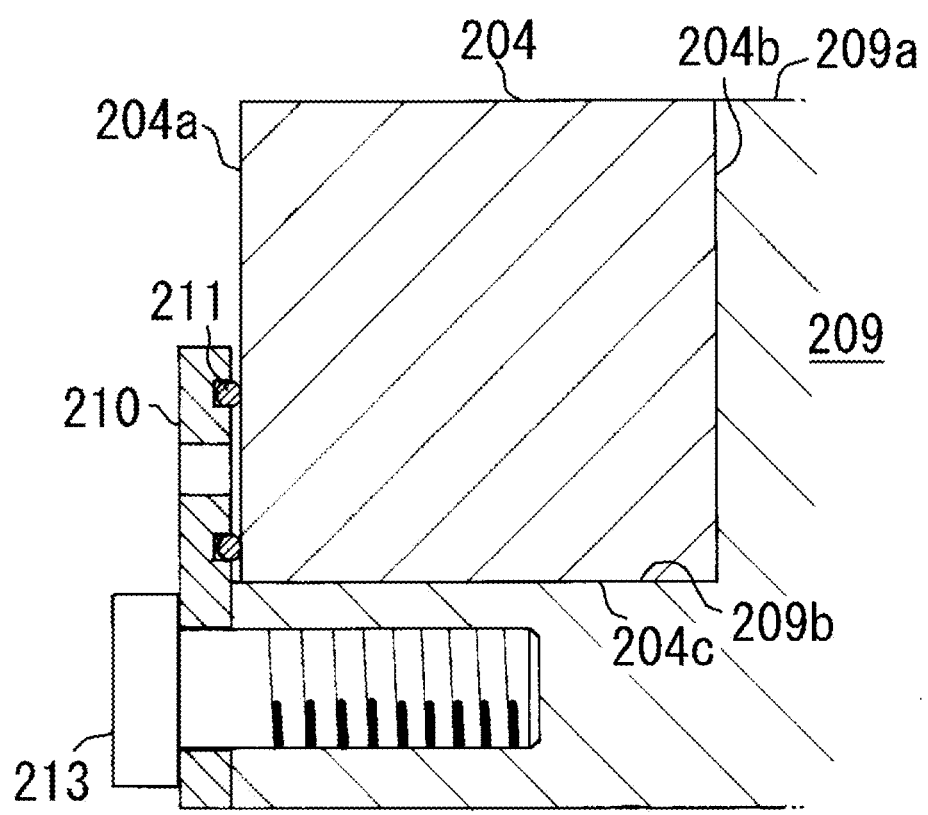
FIG. 18 is an enlarged view illustrating a reflecting mirror holder of FIG. 15.

As illustrated in FIGS. 16 and 18, in the retaining plate 210, while the O-ring 211 faces the front surface portion 204a of the reflecting mirror 204 mounted on the seat surface of the recessed portion 209b of the reflecting mirror holder 209, the retaining screw 213 threaded through the hole portion 210b is fastened and mounted on an outer surface positioned under the recessed portion 209b of the reflecting mirror holder 209. With fixing of the retaining plate 210, the O-ring 211 is pressed against the front surface portion 204a of the reflecting mirror 204, the reflecting mirror 204 is elastically urged rearward, and the reflecting mirror 204 is held in the recessed portion 209b. In addition, while the O-ring 211 is pressed against the front surface portion 204a of the reflecting mirror 204 to elastically urge the reflecting mirror 204, an inner surface of the lower half portion of the retaining plate 210 is connected to an outside end surface under the recessed portion 209b of the reflecting mirror holder 209 to have metal-to-metal touch.

As illustrated in FIG. 14, in the present embodiment, the reflecting mirror 204 mounted on the seat surface of the recessed portion 209b is elastically urged toward a back surface portion 204b of the reflecting mirror 204 by pressing the O-rings 211 against the front surface portion 204a by three retaining plates 210 mounted at predetermined intervals to the outer surface under the recessed portion 209b of the reflecting mirror holder 209, and further, both side surfaces of both longitudinal end portions of the reflecting mirror 204 are also elastically urged toward the other opposite side by pressing the O-rings 211 against the side surface portions by the retaining plates 210 mounted to both side end portions of the reflecting mirror holder 209, and the reflecting mirror 204 is held and mounted on the reflecting mirror holder 209.

Figure 19:
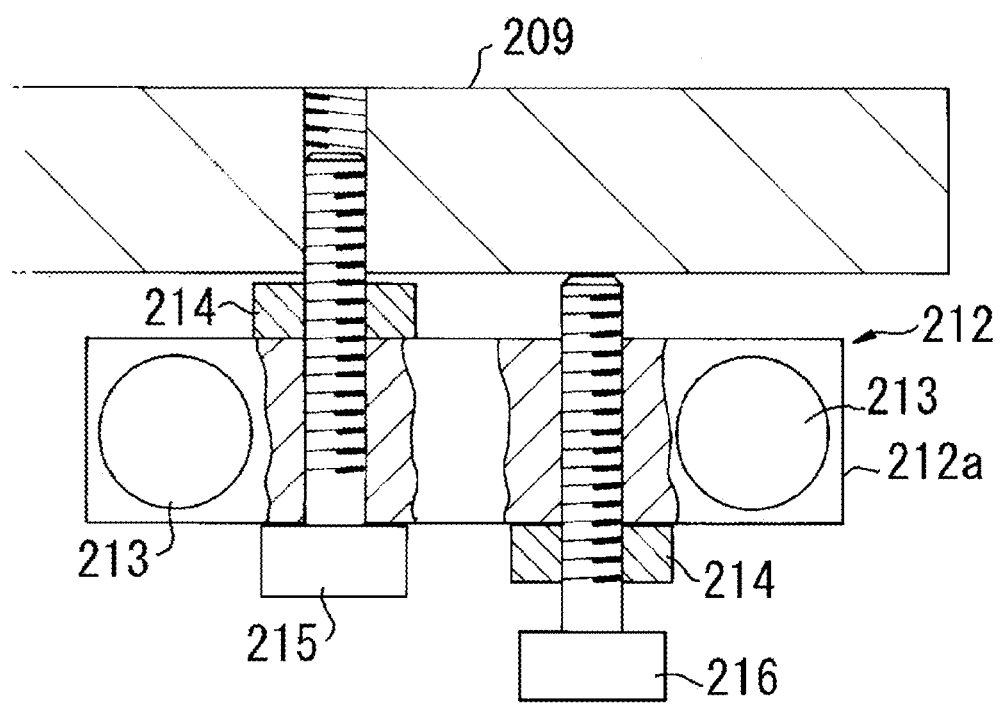
FIG. 19 is a cutaway plan view illustrating a main part of a orientation adjusting unit of FIG. 15.

Further, as illustrated in FIG. 19, in the orientation adjustment unit 212 provided at the reflecting mirror holder 209, an orientation adjuster 212a is integrally fastened to the upper surface of the table 203 with the retaining screws 213 and 213, and a machined bolt 215 and a tap bolt 216 are pressed against or threaded into a side surface of the reflecting mirror holder 209 across lock nuts 214 and 214 from a side part of the orientation adjuster 212a. The threaded depths or pressing amounts of the machined bolt 215 and the tap bolt 216 to the reflecting mirror holder 209 holding the reflecting mirror 204 are appropriately adjusted, a mounting position of the reflecting mirror holder 209 to the table 203, or connecting position (connecting angle) of the reflecting mirror holder 209 to the side of the table 203 is displaced, and holding orientation of the reflecting mirror 204 to the table 203 is adjusted.

The reflecting mirror supporting structure of the present embodiment including these members can hold the reflecting mirror 204 on the table 203 according to the following procedure.

First, the reflecting mirror holder 209 is temporarily fixed on the table 203, and then the reflecting mirror 204 is mounted and supported on the recessed portion 209b of the reflecting mirror holder 209.

Next, the retaining plate 210 is disposed so that the O-ring 211 faces the front surface portion 204a of the reflecting mirror 204, the retaining plate 210 is fastened to the outer surface positioned under the recessed portion 209b of the reflecting mirror holder 209 with the screw, the O-ring 211 is pressed against the front surface portion 204a of the reflecting mirror 204 to elastically urge the reflecting mirror 204 rearward, both side surfaces of both longitudinal end portions of the reflecting mirror 204 are also urged toward the other opposite side, by bringing the O-rings 211 into elastic pressure-contact with the side surface portion by the retaining plates 210 mounted to both side end portions of the reflecting mirror holder 209, and the reflecting mirror 204 is held on the seat surface in the recessed portion 209b.

A holding orientation of the reflecting mirror 204 by the reflecting mirror holder 209 to the table 203 is adjusted by the orientation adjustment unit 212, a fixing bolt 217 inserted through a through-hole of the mounting portion 209a of the reflecting mirror holder 209 is threaded into a hole portion formed in the upper surface of the table 203, the reflecting mirror holder 209 is really fixed to the table 203, and mounting of the reflecting mirror 204 to the table 203 is finished.

According to the reflecting mirror supporting structure of the present embodiment, the reflecting mirror 204 is mounted to the table 203 through the reflecting mirror holder 209 without being directly fixed to the table 203, so that the reflecting mirror 204 is not directly subjected to the influence of temporal change, or the deformation of the table 203 itself which is caused upon movement of the table 203 on the stage 202. Further, the O-ring 211 provided on the retaining plate 210 is pressed against the surface of the reflecting mirror 204 to hold the reflecting mirror 204 on the reflecting mirror holder 209, so that the influence of local deformation on the reflecting mirror 204 is minimized, and mirror accuracy of the reflecting mirror 204 can be maintained at the initial manufacturing accuracy.

Further, after the holding orientation of the reflecting mirror 204 is adjusted by the orientation adjustment unit 212, the reflecting mirror holder 209 is fixed to the table 203, so that adjustment of orientation does not deform the reflecting mirror 204, the holding force for the reflecting mirror 204 after adjustment can be secured, and the reflecting mirror 204 can be maintained in the orientation having been adjusted.

Figure 20:
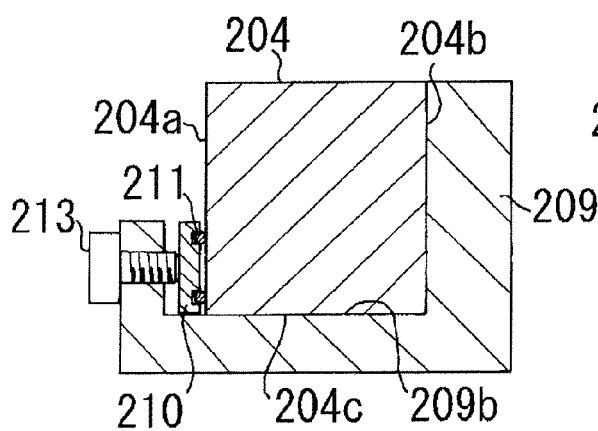
FIGS. 20A and 20B are diagrams illustrating other modes of a reflecting mirror supporting structure according to the second embodiment.
Figure 20:
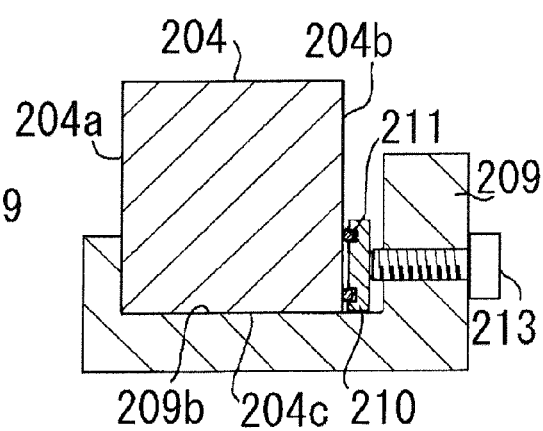

It is noted that, in the embodiment having been illustrated, the recessed portion 209b of the reflecting mirror holder 209, configured to house the reflecting mirror 204, is provided to have a shape in which the outside part of the reflecting mirror holder 209 is recessed stepwisely along the longitudinal direction, but may be provided to have a shape in which an upper surface of the reflecting mirror holder 209 is recessed to have a recess deep enough to house the reflecting mirror 204. Further, as illustrated in FIG. 20A, the reflecting mirror holder 209 may be configured such that the reflecting mirror 204 and the retaining plate 210 including the O-ring 211 are disposed in the recessed portion 209b, the O-ring 211 is pressed against the front surface portion 204a of the reflecting mirror 204 to press the reflecting mirror 204 toward the back surface portion 204b. Alternatively, as illustrated in FIG. 20B, the reflecting mirror holder 209 may be configured such that the O-ring 211 is pressed against the back surface portion 204b of the reflecting mirror 204 to press the reflecting mirror 204 toward the front surface portion 204a, and the reflecting mirror 204 is held on the recessed portion 209b.

Further, the O-rings 211 of the retaining plates 210 are provided to make elastic pressure-contact with the front surface portion 204a and both side surface portions of the reflecting mirror 204, but the retaining plate 210 may be mounted to the upper surface portion of the reflecting mirror 204 for contact with the O-ring 211, and the O-ring 211 elastically urges the reflecting mirror 204 downward. Another elastic body may be employed instead of the O-ring 211. Further, in the embodiment, the mode of the reflecting mirror 204 disposed in the vacuum container 201 has been described, but the present embodiment can be applied to a mode of the laser interferometer 205 and the reflecting mirror 204 mounted on another apparatus mounted in the atmosphere.

The exemplary mode of the reflecting mirror 204, the reflecting mirror holder 209, the retaining plate 210, and the orientation adjustment unit 212 has been illustrated, but the present embodiment is not limited to this mode, and can include any other appropriate mode.

<Third Embodiment: Mounting Structure of Stage in Vacuum Container>

(Field)

The present embodiment relates to a mounting structure of a stage in a vacuum container (vacuum chamber) including the stage mounted to an inspection apparatus for inspecting a sample, or a semiconductor producing apparatus processing a material, or the like in a vacuum.

(Background)

Figure 28:
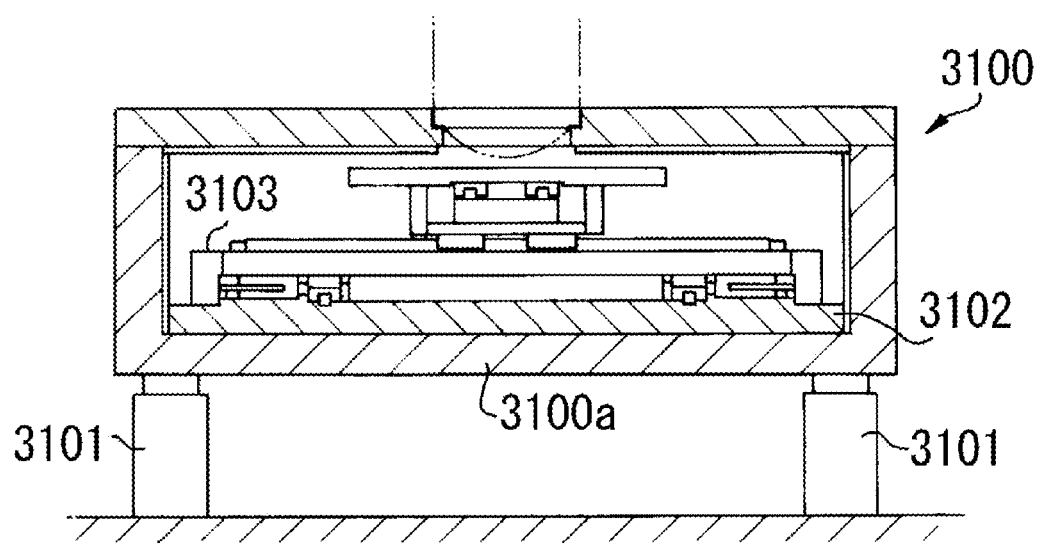
FIG. 28 is a cross-sectional view illustrating a configuration of a conventional vacuum container.

FIG. 28 is a diagram illustrating an exemplary configuration of the vacuum container including the stage mounted to the inspection apparatus or the semiconductor producing apparatus, a vacuum container 3100 is supported horizontally on an anti-vibration mount 3101, and has a bottom plate 3100a having an upper surface on which a stage base 3102 is housed, and a stage 3103 configured to move while holding an object as the sample or material thereon is mounted on the stage base 3102 (e.g., see JP 2011-65956 A).

Such a vacuum container 3100 is designed rigidly (high rigidity) to reduce deformation thereof caused by a differential pressure between a vacuum in the container and atmospheric pressure outside the container. An apparatus for finely processing an object or an apparatus for inspecting a finely processed object is required to have a high stage performance (traveling accuracy or positioning accuracy) for accurately moving the held object to a predetermined position. Therefore, the bottom plate 3100a of the vacuum container 3100, being a reference surface for mounting the stage 3103 is especially designed highly rigidly to reduce the deformation caused by the differential pressure. In addition, as illustrated in FIG. 28, to reduce vibration from a floor on which the apparatus is installed, a lower surface of the bottom plate 3100a of the vacuum container 3100 is designed to be supported at a plurality of points by an anti-vibration device (anti-vibration mount 3101) including an air spring or a vibration control device.

Generally, the stage 3103 is mounted in the vacuum container 3100 through a process of integrally assembling the stage 3103 on the stage base 3102, adjusting the assembly, and mounting the assembly on the bottom plate 3100a of the vacuum container 3100.

Further, a vacuum container having the following configuration is known. In order to fix a stage in the vacuum container based on an accurate reference surface, the vacuum container is mounted on a stone surface plate, a plurality of fixing bases for supporting the lower part of the stage is caused to penetrate the bottom plate of the vacuum container to be directly fixed to the upper surface of the stone surface plate (e.g., see JP 2004-235226 A).

(Summary)

Even if the vacuum container for housing the stage is designed to have higher rigidity as described above, deformation of the vacuum container caused by a differential pressure between a vacuum and the atmospheric pressure cannot be completely eliminated, and, when the differential pressure between the inside and outside of the container increases, slight deformation always occurs in the vacuum container as a whole.

Even a slight deformation of the bottom plate of the vacuum container, as the reference surface for mounting the stage, considerably influences the traveling accuracy of the stage. Therefore, the container needs to be designed to avoid the deformation thereof as much as possible, but a conventional container having higher rigidity only at a bottom plate cannot completely eliminate occurrence of the deformation, and performance of the stage is inevitably deteriorated.

Further, assembly and adjustment of the stage is necessarily performed in an atmospheric pressure environment, but actual operation is performed in a vacuum environment of the vacuum container. Deformation of the reference surface inhibits the maintenance of initial adjustment accuracy. It is also considerably difficult, rather unrealistic, to adjustably assemble the stage in consideration of displacement of the reference surface in a vacuum with the deformation of the container beforehand. Additionally, further higher rigidity of the bottom portion increases the size of the bottom portion of the vacuum container, increases the size of the vacuum container or an apparatus using the vacuum container, and increases the weight and in cost, despite aiming at the minimum displacement of the reference surface.

As in the related art, when a plurality of fixing bases for supporting the lower part of a stage in a vacuum container is directly fixed to the upper surface of a stone surface plate for supporting the lower part of the vacuum container, influence of the deformation of the bottom plate of the vacuum container to the stage is considerably reduced. However this structure requires mounting, on the plurality of fixing bases, of a guide for the travel of the stage and mounting of a stage body on the guide for travel on the stage, and a reference surface for mounting the stage is positioned on the upper surfaces of the fixing bases. Therefore, this configuration has the following problems. It is difficult to adjust the upper surfaces of the fixing bases to a fixed height and fix the upper surfaces to the stone surface plate, and it is difficult to accurately assemble the stage on the fixing bases, an increased adjustment time leads to expensive assembly cost, and thus whole of the apparatus becomes expensive.

The present embodiment has been made to overcome the problems of the related art, and an object of the present embodiment is to provide a mounting structure of a stage in a vacuum container with which the size of a vacuum container is not increased, deformation of the container due to a differential pressure does not generate displacement of a reference surface on which the stage is mounted, high stage performance is maintained, the stage is highly precisely assembled and adjusted.

As described above, when the fixing bases for supporting the lower part of the stage are fixed on the upper surface of the stone surface plate under the vacuum container, the influence on the stage due to the deformation of the bottom plate of the vacuum container can be inhibited, but it is difficult to accurately mount the stage on the fixing bases. Therefore, in the present embodiment, a configuration is provided in which a rail portion on which a movable portion of a stage is linearly moved is directly fixed on a stone surface plate, a stage body is provided to travel along the rail portion, or a reference surface on which the stage is mounted is positioned on the upper surface of the stone surface plate, so that the stage is accurately assembled and adjusted, the reference surface is prevented from being displaced regardless of the deformation of a vacuum container, and traveling accuracy or positioning accuracy of the stage having been adjusted is maintained.

That is, to solve the above-mentioned problems, the present embodiment is configured such that, in a structure for mounting the stage in the vacuum container mounted on the stone surface plate, the rail portion of a linear guide configured to guide linear movement of the movable portion of the stage is directly mounted to an upper surface of the stone surface plate facing a lower surface of a bottom plate through an opening portion formed in the bottom plate of the vacuum container.

According to this configuration, the rail portion of the linear guide, as a track path for the stage is directly fixed on the upper surface of the stone surface plate having high rigidity and accurate profile irregularity readily secured, so that the stage linearly moving along the linear guide is highly precisely mounted, and the performance is adjusted.

That is, the stone surface plate having the upper surface with the accurate profile irregularity, has a volume (thickness), includes high rigidity and a low linear expansion coefficient compared with a metal material, so that deformation or expansion of the stone surface plate itself is considerably reduced upon a vacuum condition in the vacuum container, and the profile irregularity of the upper surface is accurately secured.

Accordingly, the stage mounted on the upper surface of the stone surface plate mounted as the reference surface has traveling accuracy or positioning accuracy which are not deteriorated under the influence of the displacement of the reference surface. Therefore the stage can be adjustably assembled in the container without consideration of a deformation degree or the like of the vacuum container evacuated, an initial traveling performance can be maintained after adjustment, and an object held in a vacuum can be moved to an accurate position for positioning. The upper surface of the stone surface plate is formed as the reference surface for mounting the stage, therefore, it is not necessary to increase the rigidity or the size of the bottom plate of the vacuum container.

In the mounting structure of the stage having the above-mentioned configuration, the inside of the vacuum container is configured such that, in order to secure the air-tightness, the bottom plate of the vacuum container and the upper surface of the stone surface plate are vacuum-sealed, and the vacuum container is formed into a hermetic space isolated from the outside. The vacuum seal is formed by mounting a sealing member such as an O-ring around the opening portion formed in the bottom plate of the vacuum container, and isolating the inside of the opening portion to be vacuumed from the upper surface of the stone surface plate in the atmosphere.

Further, in addition to or separate from the vacuum seal around the opening portion, a space between the peripheral vicinity of the lower surface of the bottom plate of the vacuum container and the upper surface of the stone surface plate may be provided to be vacuum-sealed and evacuated from an exhaust port communicating with the space between lower surface of the bottom plate and the upper surface of the stone surface plate provided in a side part of the bottom plate, for evacuation of the space from the exhaust port.

According to this configuration, whole of the lower surface of the bottom plate of the vacuum container facing the upper surface of the stone surface plate can be maintained in a vacuum, the influence of the change in outside temperature on the atmospheric pressure in the vacuum container can be reduced, and further even when vacuum seal performance around the opening portion of the bottom plate cannot be secured, the space of the whole of the lower surface of the bottom plate of the vacuum container is evacuated, and a vacuum degree in the vacuum container can be preferably maintained.

Further, in addition to the opening portion through which the rail portion of the linear guide is inserted, with a configuration in which at least one other additional opening portion vacuum-sealed peripherally is provided in the bottom plate of the vacuum container, when the linear guide is mounted and the stage body is adjustably assembled on the linear guide, the upper surface of the stone surface plate, as the reference surface for mounting the stage, can be visually confirmed and measured usefully through the at least one other opening portion, and thus highly accurate assembling, adjustment, and visual confirmation of the stage is allowed.

According to the present embodiment, the stage can be operated so that the object held in a vacuum can be moved to the accurate position for positioning, while maintaining the initial traveling performance upon assembly and adjustment of the stage, without increasing the size of the vacuum container, and without the displacement of the reference surface on which the stage is mounted, regardless of the change in atmospheric pressure in the vacuum container. The reference surface for mounting the stage is the upper surface of the stone surface plate, and the displacement thereof is considerably small, so that the stage can be adjustably assembled highly accurately without consideration of the deformation degree or the like of the vacuum container upon evacuation.

Specific Configuration

One preferable embodiment of the present embodiment will be described based on the drawings. It is noted that each of the drawings mainly illustrates the mounting mode of the vacuum container, the stage mounted in the vacuum container, and the stone surface plate. Detailed configuration of the stage body, or illustration of the other apparatuses or devices mounted to the inspection apparatus or the semiconductor producing apparatus together with the vacuum container, such as a vacuum pump, an air pipe, or an exhaust pipe mounted to the vacuum container, is omitted.

Figure 22:
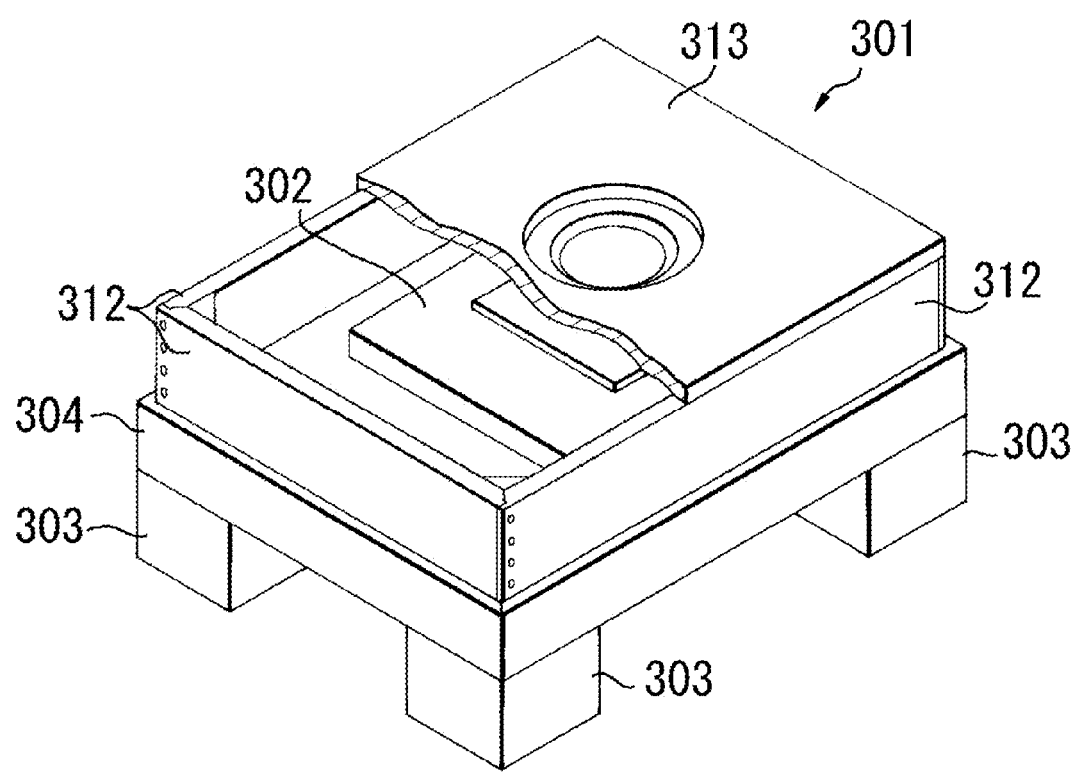
FIG. 22 is a cutaway appearance view illustrating a main part of a vacuum container according to a third embodiment.
Figure 23:
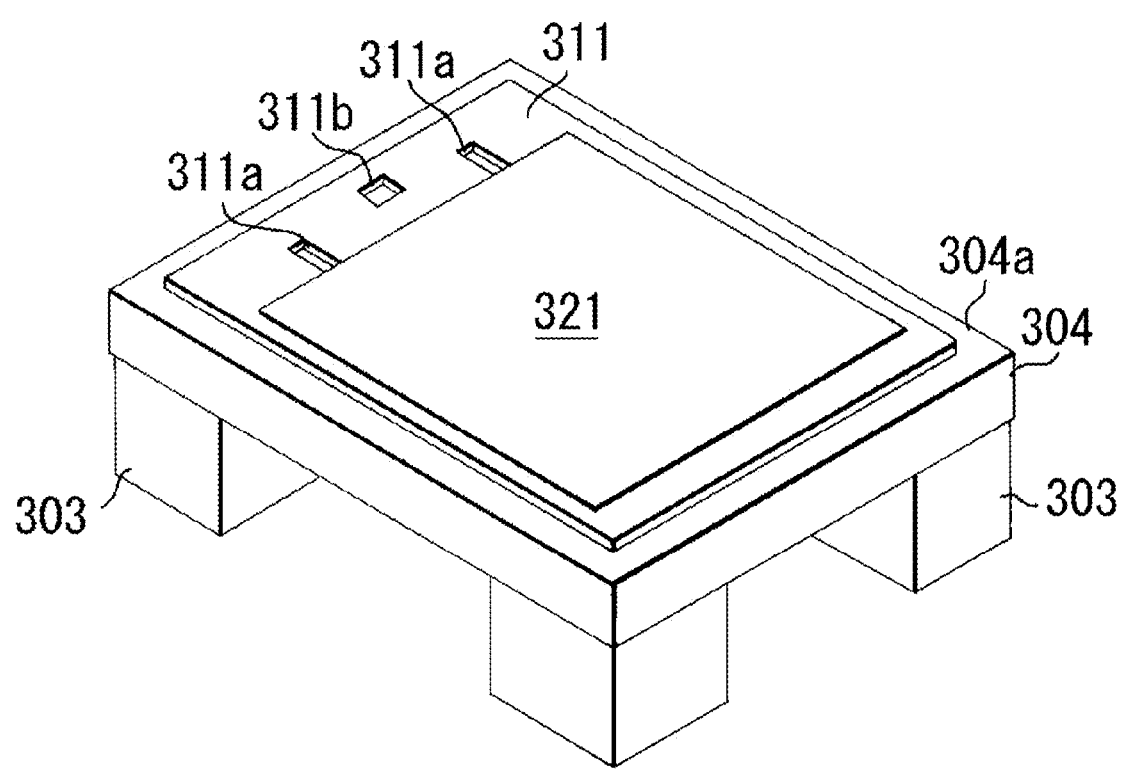
FIG. 23 is an appearance view illustrating a main part of a vacuum container of FIG. 22 from which side plates and an upper plate are removed.

FIG. 22 is an appearance view illustrating a main part of a vacuum container of the present embodiment which is applied to the inspection apparatus, and FIG. 23 is an appearance view illustrating a main part of the vacuum container from which side plates and an upper plate are removed. As illustrated in FIGS. 22 and 23, in a vacuum container 301, a stage 302 having a stage body 321 for holding and moving the object as a sample to be inspected is mounted, the stage 302 is mounted on a stone surface plate 304 supported on anti-vibration devices 303, a linear guides 322 constitutes the stage 302, each of the linear guides 322 has a rail portion 322a exposed downward through an opening portion 311a formed in a bottom plate 311 of the vacuum container 301, the exposed portion is directly fixed and mounted on an upper surface 304a of the stone surface plate 304 oppositely put under the bottom plate 311 (see FIGS. 25 and 26).

Especially, the vacuum container 301 includes the bottom plate 311, four side plates 312, and an upper plate 313. The bottom plate 311 has a square shape in a planar view. The four side plates 312 surround the bottom plate 311. The upper plate 313 is configured to close an upper end opening among the four side plates 312. The plates are each obtained by processing a steel plate, and the plates are assembled into a square box shape.

Figure 25:
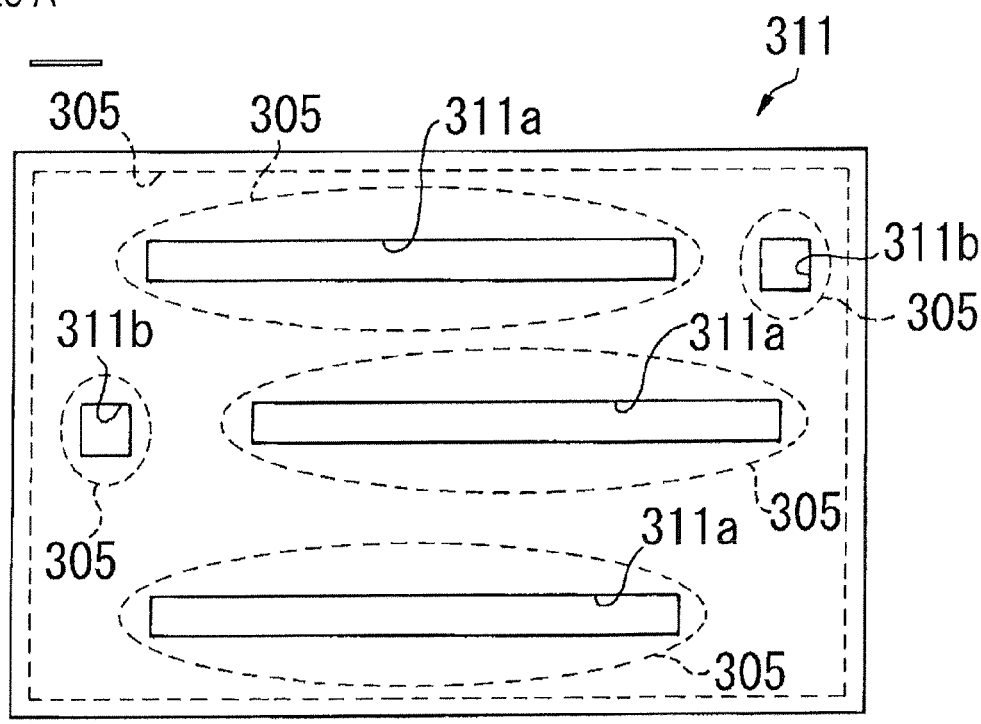
FIG. 25A is a plan view illustrating the bottom plate constituting the vacuum container of FIG. 22.
FIG. 25B is a side view thereof.
Figure 25:
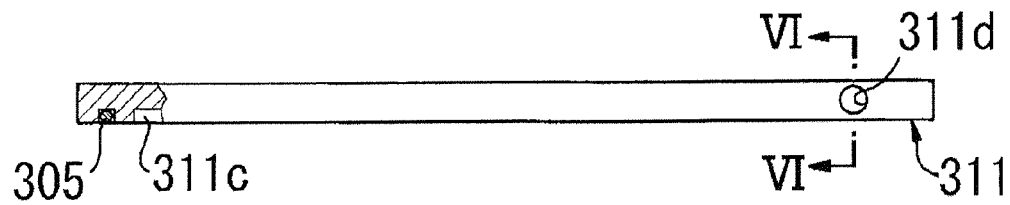

As illustrated in FIG. 25, the bottom plate 311 includes, in the surface thereof, the plurality of opening portions 311a, and at least one other opening portion 311b. Each of the plurality of opening portions 311a, three opening portions 311a in FIG. 25, has a width large enough to insert the rail portion 322a of the linear guide 322, described below, and extends in the longitudinal direction of the bottom plate. The at least one other opening portion 311b has a square shape in a planar view, and provided in the vicinity of both transverse sides of the bottom plate.

Further, the lower surface of the bottom plate 311 is provided with a recessed portion 311c recessed to have a certain width, in a portion formed with the opening portions 311a and 311b and inside from the peripheral side portions of the bottom plate, and a side surface of the bottom plate 311 is formed with an exhaust port 311d communicating with the recessed portion 311c.

It is noted that, as described below, on the lower surface of the bottom plate 311, an O-ring 305 as a sealing member is mounted to surround each of the opening portions 311a and 311b, and the recessed portion 311c, and the inside of each of the opening portions and the recessed portion, and the stone surface plate 304 are vacuum-sealed (see FIG. 27).

Figure 24:
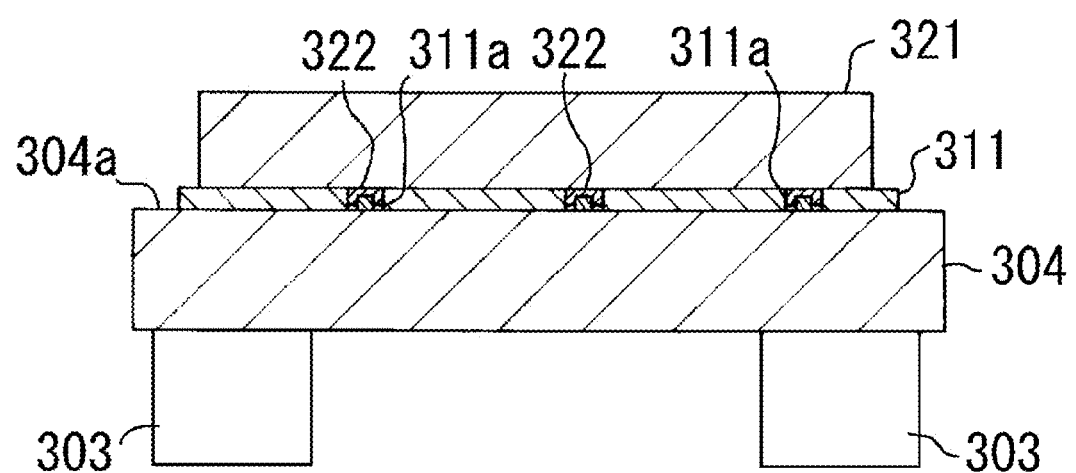
FIG. 24 is a fragmentary cross-sectional view illustrating a mounting mode of a stone surface plate, a bottom plate, and a stage in the vacuum container of FIG. 22.
Figure 26:
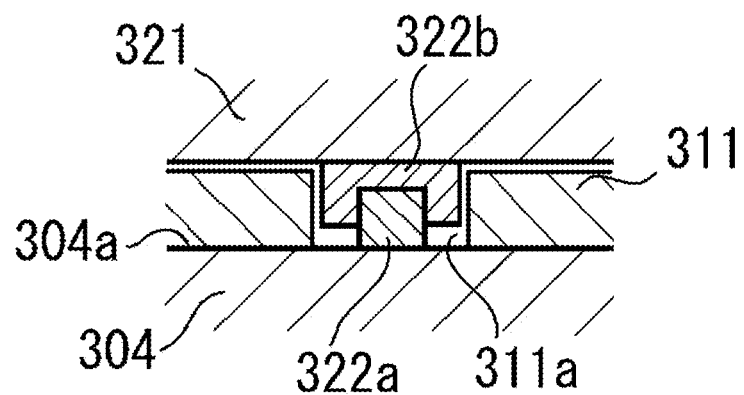
FIG. 26 is an enlarged view illustrating a guide rail mounted portion of FIG. 24.

The stage 302 includes the stage body 321 having a lower stage and an upper stage which are disposed to be vertically superposed, and linearly moved by a motor (not illustrated) in mutually orthogonal directions, and the plurality of linear guides 322 each configured to linearly guide the movable portion of the lower stage. As illustrated in FIGS. 24 and 26, each of the linear guides 322 has the rail portion 322a fixed to the upper surface 304a of the stone surface plate 304 through the opening portion 311a formed in the bottom plate 311 of the vacuum container 301, the movable portion of the stage body 321 is coupled to a guide block portion 322b sliding on the upper surface of the rail portion 322a, and the stage body 321 is linearly moved on the bottom plate 311 of the vacuum container 301 along the rail portion 322a.

The stone surface plate 304 includes granite, and is formed into a hexahedral block shape having a vertical thickness of 100 mm or more, and has the whole surfaces, including the upper surface 304a, formed into a highly precise smooth surface to have a flatness of 0 or more according to JIS.

The vacuum container 301 according to the present embodiment is mounted to the inspection apparatus in the following procedure. First, the stone surface plate 304 is supported on the anti-vibration devices 303, and while the bottom plate 311 of the vacuum container 301 is laid on the upper surface 304a of the stone surface plate 304, the rail portion 322a of the linear guide 322 of the stage 302, previously combined with the guide block 322b, is fitted into each opening portion 311a in the bottom plate 311, the rail portion 322a is put on the upper surface 304a of the stone surface plate 304, and the rail portion 322a is fastened on the upper surface 304a of the stone surface plate 304 with a retaining screw or the like. It is noted that the rail portion 322a of the linear guide 322 may be previously mounted on the upper surface 304a of the stone surface plate 304 before the bottom plate 311 is mounted.

Figure 27:
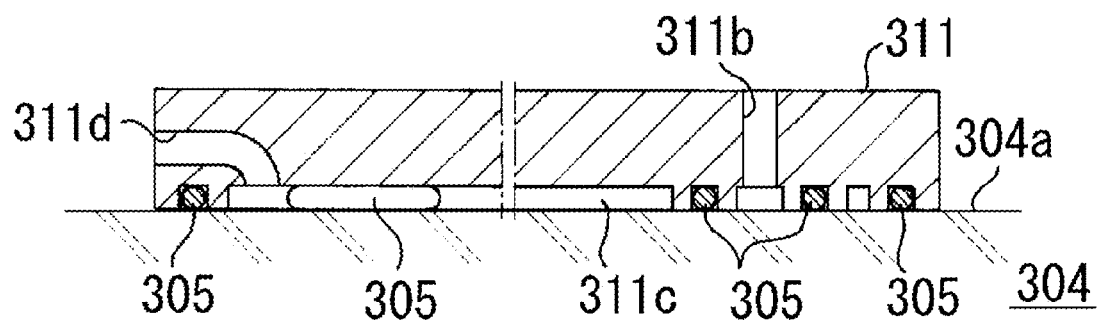
FIG. 27 is an enlarged cross-sectional view illustrating a main part taken along line VI-VI of FIG. 25 where the bottom plate is mounted on the stone surface plate.

In this case, as illustrated in FIG. 27, on the lower side of the bottom plate 311 in which the opening portions 311a and 311b, and the recessed portion 311c are formed, the O-rings 305 are mounted so as to surround the opening portions and the recessed portion, the O-rings 305 are elastically brought into pressure-contact with the lower surface of the bottom plate 311 and the upper surface 304a of the stone surface plate 304, opposing upper surface 304a of the stone surface plate 304, the inner spaces of the opening portions 311a and 311b, and the inner space of the recessed portion 311c are isolated by the O-rings 305. Further, the exhaust port formed in the side surface of the bottom plate 311 is connected with an exhaust pipe connected to the vacuum pump.

Next, the stage body 321 is assembled on the linear guides 322, or on the guide blocks 322b, with the upper surface 304a of the stone surface plate 304 as the reference surface of mounting. Further, the four side plates 312 of the vacuum container 301 are mounted around the bottom plate 311, and the operation of the stage 302 is adjusted based on the reference surface.

After a ventilation system on the inside and outside of the vacuum container 301, such as the air pipe or the exhaust pipe of the vacuum pump is mounted, including the exhaust pipe mounted to the exhaust port 311d of the bottom plate 311, the upper end opening among the four side plates 312 is closed by mounting the upper plate 313, and the mounting of the vacuum container 301 is completed.

The inspection of the object using the inspection apparatus is performed while the vacuum container 301 is evacuated. It is noted that, the inspection of the object using the inspection apparatus may be performed while the recessed portion 311c of the bottom plate 311, as the space in which the lower surface of the bottom plate 311 and the upper surface 304a of the stone surface plate 304 are opposed, has been evacuated through the exhaust port 311d in the bottom plate 311 of the vacuum container 301, according to a condition such as a vacuum degree or change in outside temperature in the vacuum container 301.

In this inspection, evacuation of the vacuum container 301 deforms the vacuum container 301 due to the differential pressure between the inside and outside of the container, but in the stage 302 in the container, the rail portion 322a of the linear guide 322 as the track path for the stage body 321 is directly fixed and mounted to the upper surface 304a of the stone surface plate 304 having sure high rigidity and accurate profile irregularity, so that the upper surface 304a of the stone surface plate 304 is prevented from being displaced with the deformation of the vacuum container 301, and the stage 302 can move and position the object held in a vacuum to the accurate position.

In addition, the opening portions 311a and 311b formed in the bottom plate 311 of the vacuum container 301 are surrounded by the O-ring 305 on the lower surface sides, and the upper surface 304a of the stone surface plate 304 around them is vacuum-sealed, so that the inside of the vacuum container 301 is maintained in a vacuum regardless of the operation of the stage 302. Further, the recessed portion 311c of the bottom plate 311 is surrounded by the O-ring 305, and the inner space of the recessed portion 311c is evacuated, so that whole of the lower surface of the bottom plate 311 is maintained under vacuum, and the influence of the change in outside temperature on the atmospheric pressure in the vacuum container 301 can be reduced.

Further, the rail portion 322a of the linear guide 322, as the direct track path for the stage body 321 of the stage 302, is directly fixed to the upper surface 304a of the stone surface plate 304, therefore, the stage 302 is readily accurately assembled, and the stage 302 is adjustably mounted highly precisely on the bottom plate 311, with the upper surface 304a of the stone surface plate 304 as the reference surface.

It is noted that, the exemplary mode of the vacuum container 301 and the stage 302 has been illustrated, but the present embodiment is not limited to this mode, and can include any other appropriate mode.

<Fourth Embodiment: Structure of Vacuum Magnetic Shield Container>

(Field)

The present embodiment relates to a vacuum magnetic shield container, or so-called a vacuum chamber (hereinafter also referred to as "vacuum container") mounted to an electron beam inspection apparatus using charged particle radiation such as an electron beam or an ion beam or an electron beam apparatus such as electron-beam lithography.

(Background)

Figure 36:
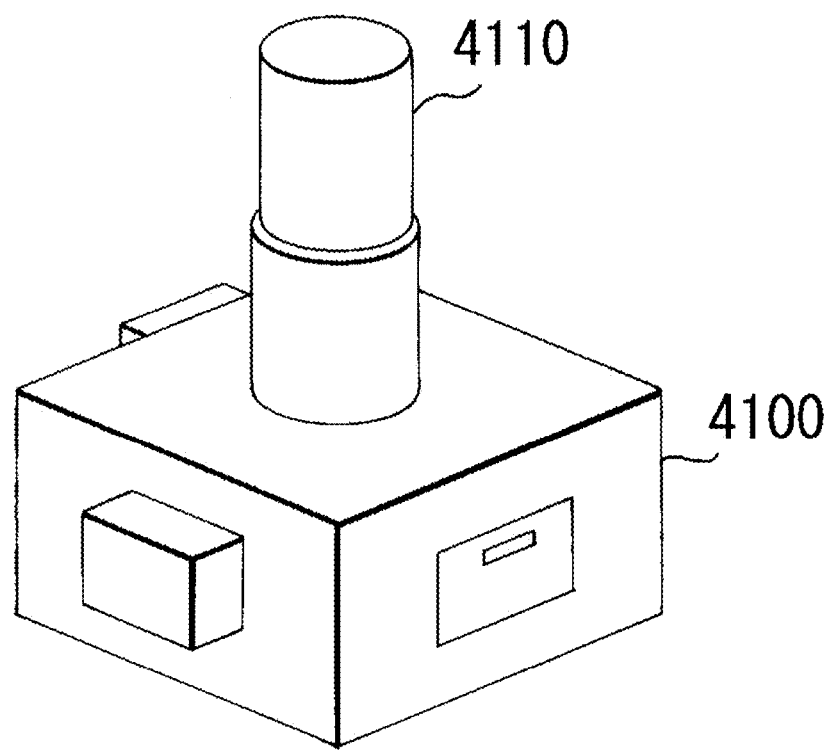
FIG. 36 is a view illustrating an example of a conventional electron beam apparatus including a vacuum container and a lens barrel.

For example as illustrated in FIG. 36, an electron beam apparatus is configured such that a lens barrel 4110 including, on the inside, a primary electron optical system configured to emit an electron beam to the surface of the sample and a secondary electron optical system configured to image a secondary electron radiated from the sample on an electron detection surface of a detector is provided at the upper part of a vacuum container 4100 into which a stage configured to hold and move a sample such as a wafer or a mask is incorporated (e.g., see JP 2010-56390 A).

Here, in order to secure the stability and straightness of an electron beam in an electron orbit region in the apparatus, ranging from the vacuum container 4100 to the lens barrel 4110, it is necessary to evacuate the region and minimize magnetic influence. Therefore, the inside of the apparatus is provided to be evacuated through an exhaust pipe connected to a vacuum pump, and the vacuum container 4100 includes a magnetic material for magnetic shielding, so that magnetism on the outside of the apparatus does not influence the inside of the container, and further, is formed with high rigidity so that deformation due to decompression is not generated.

Figure 37:
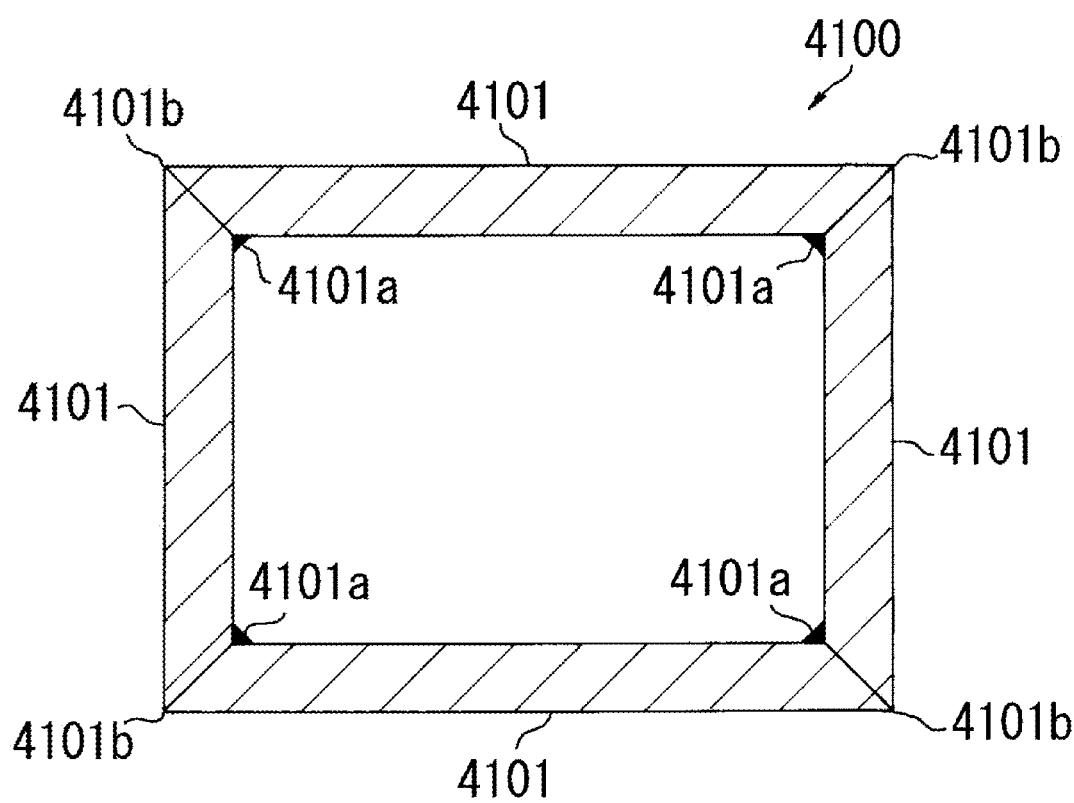
FIG. 37 is a cross-sectional view illustrating a joining mode of members of the vacuum container of FIG. 36.

The vacuum container 4100 is formed for example by machining a magnetic block body into a hollow polyhedron with five faces which is obtained by removing an upper or lower face from a cube, or by assembling a plurality of magnetic plate materials into a square box shape, and welding the ends of the plate materials. When the vacuum container is formed by welding, generally, for example as illustrated in FIG. 37, the ends of plate materials 4101 are butted to constitute peripheral walls of the vacuum container 4100. The butting ends of an inner corner portion 4101a of the vacuum container 4100 to be evacuated are wholly joined by TIG welding or the like, and the butting ends of an outer corner portion 4101b are joined by intermittent or continuous welding or the like, and the ends of the plate materials 4101 are joined to each other. It is noted that a connecting-disconnecting portion provided on a peripheral part of the vacuum container 4100 is sealed with an O-ring to maintain the air-tightness in the container.

(Summary)

As the magnetic material for forming the vacuum container 4100, generally, SS400 steel, S45C steel, or the like is possible, but the pure iron materials are basically tend to rust. Therefore, when the plate materials 4101 including the pure iron material are welded and assembled into the vacuum container 4100, the vacuum container 4100 needs to be subjected to surface treatment by nickel plating or the like, as anti-corrosion treatment.

As illustrated in FIG. 37, when the ends of the plate materials 4101 are butted and welded, the butting portion (a portion between reference signs 4101a and 4101b, in FIG. 37) always has a slight space being a gap between the butting surfaces, in addition to a part accurately integrally fixed by the welding.

The surface treatment by the nickel plating or the like includes previously degreasing the surface of the vacuum container 4100, subjecting the vacuum container to pretreatment such as immersion in a chemical liquid to improve close contact with a metal (zinc or the like) film, and welding the metal film on the surface of the vacuum container 4100. However, in this process of treatment, a washing liquid or chemical liquid having been used may enter and remain in the slight space in the butting portion between the ends of the plate materials 4101.

In order to prevent a liquid from remaining in the space, a weep hole for draining a liquid having entered is usually designed in a joined portion between the ends of the plate materials 4101. However, it is also difficult to completely drain the liquid, even by the weep hole, the remaining washing liquid or chemical liquid causes rust in the gap of the joined portion, and original corrosion resistance of the surface treatment such as nickel plating is inhibited. Propagation of rust causes deterioration in strength of the vacuum container 4100 or rust contamination. Therefore, appropriate processing against rust is required according to the material of the vacuum container 4100.

Instead of the pure iron material such as SS400 steel or S45C steel, it is possible to use an alloy steel such as permalloy having good corrosion resistance, and used for assembling the vacuum container 4100 without anti-corrosion treatment. However permalloy is very expensive, so that permalloy cannot be practically employed as the magnetic material of the vacuum container 4100. Further, as described above, the vacuum container 4100 can be formed by machining the magnetic block body, but processing cost is expensive, and as a result, a cost-expensive apparatus is provided as a whole.

The present embodiment has been made to overcome the problems of the related art, and an object of the present embodiment is to provide an inexpensive vacuum magnetic shield container configured to have rust resistance, and securely maintain a vacuum condition in the container without being influenced by a differential pressure between the container and the atmospheric pressure.

In order to form a vacuum space shielded from the atmosphere in the vacuum container, when the plate materials are assembled into a square box shape, it is necessary to integrally join the ends of the plate materials tightly. Welding is suitable to join the vacuum container, but the surface treatment is required for the pure iron material, as described above.

On the other hand, as the material of the vacuum container, a steel material having high corrosion resistance and not requiring anti-corrosion treatment, for example, stainless steel, may be used without anti-corrosion treatment after assembling and welding. However, the stainless steel is a nonmagnetic material, the use of only the stainless steel leads to deterioration in magnetic shielding, and further magnetic shielding is required.

Therefore, in the present embodiment, a vacuum container is formed into a double structure of an inner container and an outer container which are separated from each other, and both of the inner and outer containers are superposed to configure the peripheral sides of the vacuum container in order to secure the whole rigidity of the container. The inner container includes a steel material without requiring anti-corrosion treatment in order to eliminate the surface treatment after assembling. The outer container includes a magnetic steel material to magnetically shield the inside of the vacuum container in order to eliminate the influence of external magnetism.

That is, to solve the above-mentioned problems, the present embodiment is configured such that the vacuum container of the electron beam apparatus includes a stage configured to hold a sample, the vacuum container has the inner container including a steel material without requiring anti-corrosion treatment, the outer container including a magnetic steel material different from the material of the inner container and disposed to surround the inner container. The inner container holds a vacuum condition in the container, and the outer container magnetically shields the inside of the container.

According to this configuration, the inner container is formed by assembling the steel materials without requiring anti-corrosion treatment into a box-shape, so that surface treatment for corrosion resistance after assembling the vacuum container is eliminated, and the ends of the steel materials are integrally joined by welding to form a vacuum space shielded from the atmosphere in the container. Further, since the outer container includes the magnetic steel material, when the outer container is disposed to surround the inner container, the vacuum container is magnetically shielded securely, and the influence of the external magnetism in the container can be eliminated.

As the steel material without requiring anti-corrosion treatment for forming the inner container, SUS304 austenitic stainless steel or the like or another steel material having high corrosion resistance may be employed. Further, as the magnetic steel material for forming the outer container, SS400 steel, S45C steel, or the like, or another steel material having a small coercive force and a large magnetic permeability may be employed. Preferably, the outer container includes a magnetic steel material subjected to surface treatment such as nickel plating, for corrosion resistance.

The inner container can be formed by integrally joining members constituting the container by welding. On condition that fixation equal to the welding is secured, the inner container may be formed by integrally joining the members constituting the container by adhesion.

Further, the outer container may be formed by integrally joining, by fastening members constituting the container with a retaining screw such as a bolt. Therefore, the container is readily configured by assembling the members having a plate shape and readily subjected to anti-corrosion treatment. After assembling, the surface treatment is required and expensive in cost, but the members may be integrally assembled by welding so as to minimize a residual space by welding a thin plate or the like.

The inner container is formed into a size large enough to substantially fill the outer container, the vacuum container is configured such that the inner container is disposed in the outer container, and while the inside of the lens barrel mounted on the upper surface of the vacuum container and the inside of the inner container are communicated with each other, part of the outer container and the inside of the inner container are sealed.

The inner container and the outer container may be formed into a bottomed box shape having an upper opening, or a box shape having an upper lid, respectively.

Further, the inner container and the outer container may be formed into a square cylindrical shape having upper and lower openings by assembling four plate materials, respectively. The outer container may have a lower plate brought into direct contact with the lower side of the cylindrical shape formed by assembling the plate materials, and an upper plate brought into direct contact with the upper side thereof.

In this configuration, the vacuum container is configured such that the inner container is disposed in the outer container, the upper parts of both containers are mounted with the upper plate, and the lower parts are mounted with the lower plate, and the upper and lower openings are closed therewith. Sealing members such as O-rings are provided between the lower surface of the upper plate and the upper peripheral edge of the inner container, and between the upper surface of the lower plate and the lower peripheral edge of the inner container, respectively, and the inside of the inner container may be vacuum-sealed. As described above, the inner and outer containers are each formed by assembling the four plate materials into the square cylindrical shape, the containers and the upper and lower plates are assembled to each other to configure the vacuum container. Therefore, each of the members may include a panel, and the vacuum container can be produced with inexpensive processing cost.

The outer container is formed such that the lower plate is brought into contact with the lower side of the square cylindrical shape, and the upper plate is directly brought into contact with the upper side. The plates are joined to have so-called metal-to-metal touch, a size from the lower plate to the upper plate is accurately controlled easily, and the size is not influenced by the deformation of the inner container.

In the vacuum container having the above-mentioned configuration, the inside of the inner container is vacuum-sealed by the O-rings mounted between the inner container and the inside of the outer container, and between the lower surface of the upper plate and the upper surface of the lower plate. When the electron beam apparatus is operated, a space between the inside of the lens barrel mounted on the upper surface of the vacuum container, and the inside of the inner container is maintained in a vacuum, and the outside of the inner container is maintained in the atmospheric pressure. In a process in which the electron beam apparatus is operated to evacuate the inside of the apparatus from atmospheric pressure or vice versa by a vacuum pump, a stress generated in the inner container is absorbed by the deformation of the inner container. When the inner container is expected to have a large deformation, based on the design of the size or thickness of the inner container, a portion largely deformed, such as a side surface portion or the like of the inner container, may be configured to reduce inward deformation of the inner container upon decompression, by fastening the portion largely deformed to a side surface portion of the outer container with a retaining screw.

In addition, the vacuum container having the above-mentioned configuration may be configured such that the upper part of the outer container is provided with the upper plate on which the lens barrel is mounted, and the upper part of the inner container is closed by an inner lid, the inner lid is provided with an opening portion having an area substantially the same as that of the opening portion, and communicating with the inside of the lens barrel formed on the upper plate, a space between the opening portion of the inner lid and the inner surface of the upper plate is vacuum-sealed, the inside of the lens barrel and the inside of the inner container are maintained in a vacuum, and a space between the inner container and the outer container is maintained under atmospheric pressure.

According to this configuration, since the space between the inner container and the outer container is configured to have atmospheric pressure, only differential pressure corresponding to the projected area of a joint portion of the lens barrel is the main cause of deformation, a portion subjected to the main cause of deformation is considerably small compared with the whole area of the upper plate of the vacuum container, and deformation of the upper plate due to the differential pressure between the atmospheric pressure and a vacuum is minimized. As a result, the mounting position or orientation of the lens barrel mounted on the upper surface of the upper plate is subjected to minimized influence of the differential pressure, and the high precision of the electron beam apparatus can be achieved.

According to the present embodiment, the vacuum magnetic shield container securely maintaining the inside of the container in a vacuum can be configured inexpensively by a simple processing steps of welding the component members of the inner container, fastening the outer container with the retaining screw, without relying on a complexed processing of assembling component members by welding, and then subjecting the component members to the surface treatment.

Specific Configuration

The present embodiment will be described based on the drawings. It is noted that each of the drawings mainly illustrates a configuration of the vacuum container, and the other apparatus or devices such as a vacuum pump, an air pipe, or an exhaust pipe mounted to the electron beam apparatus are not illustrated.

Figure 29:
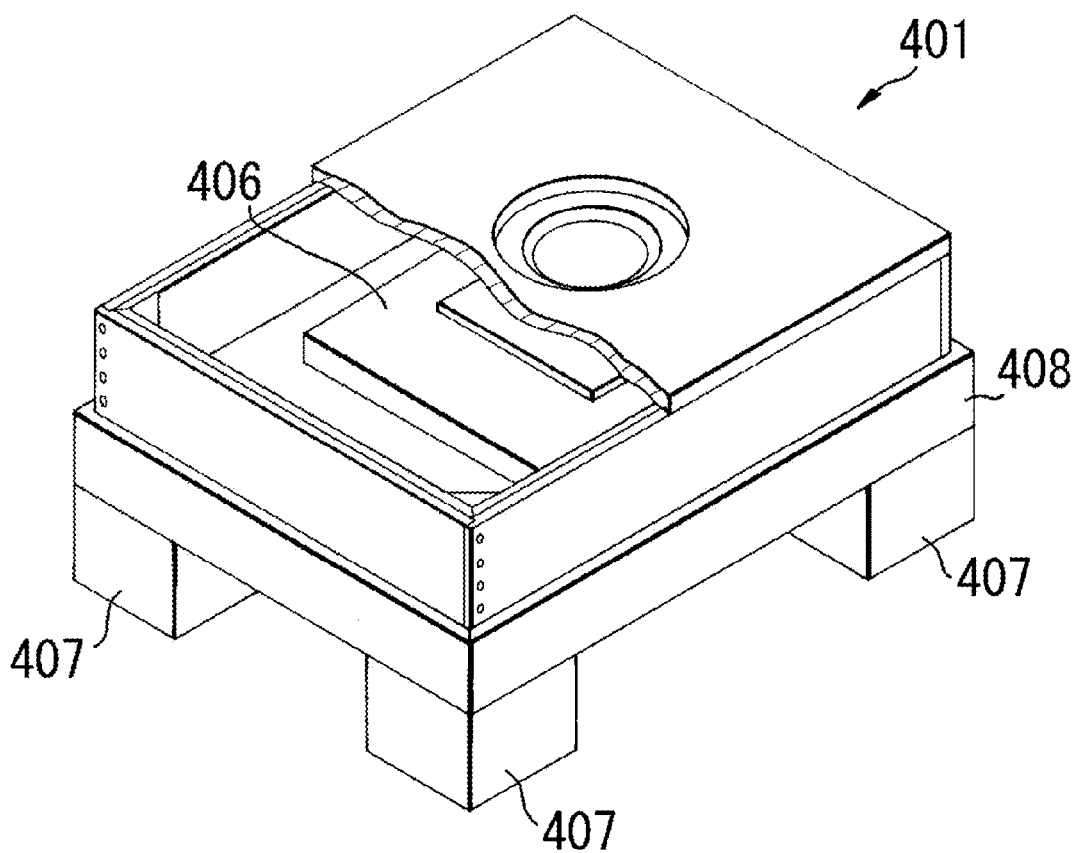
FIG. 29 is a cutaway appearance view illustrating a main part of a vacuum container according to a fourth embodiment.

FIG. 29 is a diagram illustrating the vacuum container according to the present embodiment, applied to the electron beam apparatus. As illustrated in FIG. 29, a vacuum container 401 has an inside mounted with a stage 406 configured to hold and move the sample, and has an upper surface formed with an opening portion 405a on which a lens barrel 411 is installed. The vacuum container 401 is mounted on a base member 408 such as a surface plate supported by vibration-proof or anti-vibration devices 407.

Figure 30:
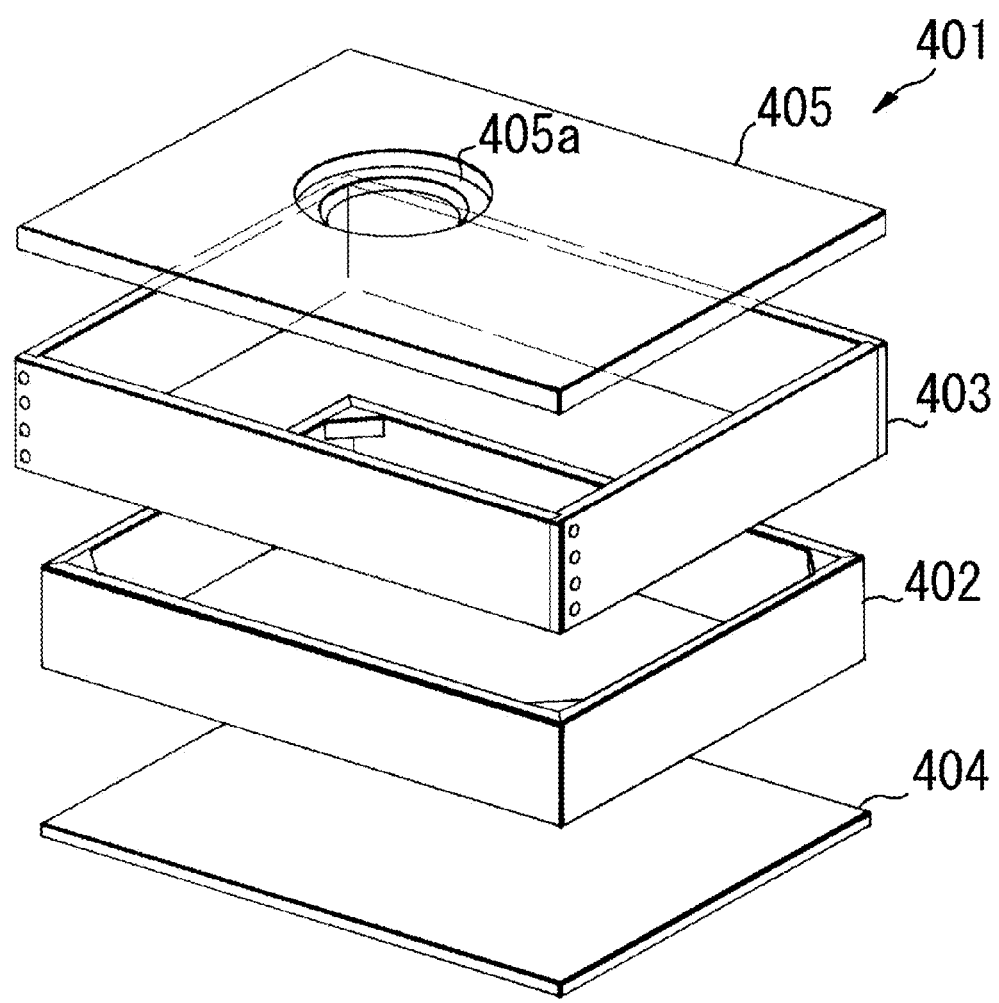
FIG. 30 is an appearance perspective view illustrating developed component members of the vacuum container of FIG. 29.

As illustrated in FIG. 30, the vacuum container 401 is formed into a hollow hexahedral box shape by combining an inner container 402, an outer container 403, a lower plate 404, and an upper plate 405. The inner container 402 has a square cylindrical shape. The outer container 403 is formed to have a size large enough to surround the peripheral surface of the inner container 402, and has a square cylindrical shape. The lower plate 404 closes the lower openings of both containers. The upper plate 405 has an upper surface formed with an opening portion 405a.

Figure 31:
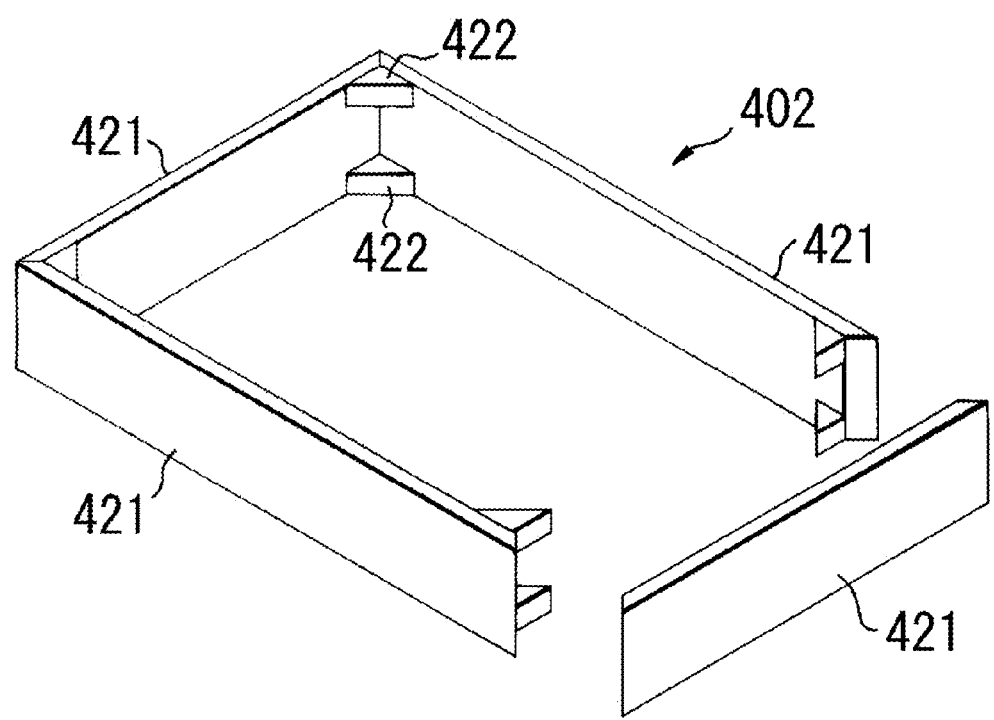
FIG. 31 is a schematic appearance view illustrating an inner container according to the fourth embodiment.

Specifically, the inner container 402 includes a steel material without requiring anti-corrosion treatment, such as stainless steel, and as illustrated in FIG. 31, four plate materials 421 having an appropriate thickness are assembled into a square shape, butting ends of plate materials 421 and 421 at each corner portion are joined integrally by welding. The inner container 402 is formed to have a size large enough to substantially fill the outer container 403, and on the inside of each corner portion is fixed with reinforcement pieces 422 and 422 by welding.

Figure 32:
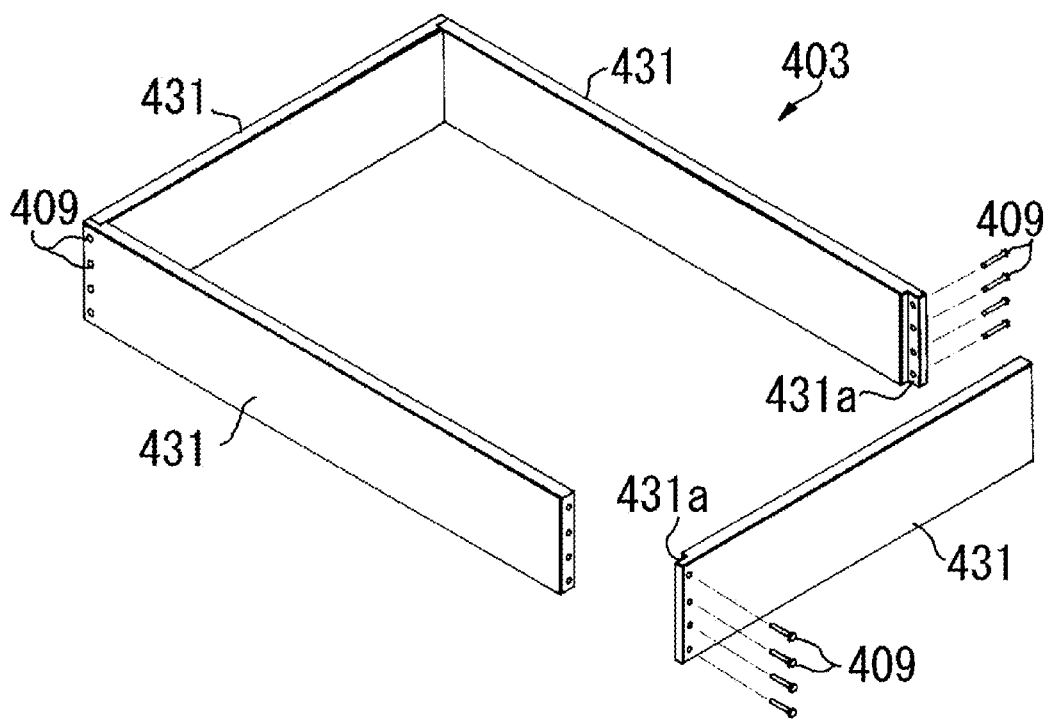
FIG. 32 is a schematic appearance view illustrating an outer container according to the fourth embodiment.

As illustrated in FIG. 32, the outer container 403 includes the magnetic steel material such as iron subjected to surface treatment such as nickel plating. The outer container 403 is formed such that, as illustrated in FIG. 32, four plate materials 431 each having an appropriate thickness and having one side end formed with a recessed surface portion 431a are assembled into a square shape by joining the recessed surface portion 431a formed at one side end of one plate material 431 to the other side end of another plate material 431, a retaining screw 409 such as a bolt is threaded into the joined portion at each corner portion to integrally fasten the joined portion, and the ends of the plate materials 431 and 431 are joined. The outer container 403 is formed to have a size large enough to substantially fill the inside thereof with the inner container 402, and surround the inner container 402.

The lower plate 404 and the upper plate 405 include a magnetic steel plate, such as iron subjected to the surface treatment such as nickel plating, as similar to the outer container 403, and have a size large enough to be joined to upper and lower opening ends of the outer container 403 having a square shape in a planar view so as to close the upper and lower openings of the outer container 403. The upper plate 405 is formed with an opening portion 405a at a mounting position of the lens barrel 411 mounted on the upper surface of the upper plate 405.

Figure 33:
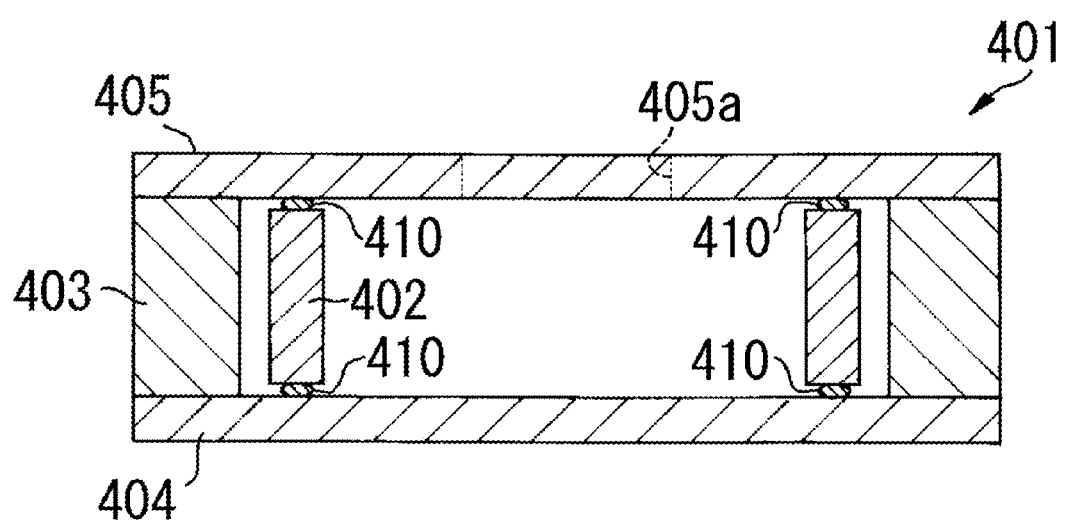
FIG. 33 is a transverse cross-sectional view illustrating the vacuum container of FIG. 29, in which a gap between the inner container and the outer container is enlarged.

As illustrated in FIG. 33, the vacuum container 401 according to the present embodiment including the members is assembled such that the inner container 402 is disposed in the outer container 403, the lower plate 404 is mounted at the lower parts of both containers 402 and 403, and the upper plate 405 is mounted at the upper parts thereof to close the upper and lower openings, the lower end of the outer container 403 and the upper surface of the lower plate 404, and the upper end of the outer container 403 and the lower surface of the upper plate 405 are joined by metal-to-metal touch for close contact between contact surfaces, O-rings 410 as a sealing member are provided in a space between the lower peripheral edge of the inner container 402 and the upper surface of the lower plate 404, and a space between the upper peripheral edge of the inner container 402 and the lower surface of the upper plate 405, and the inside of the inner container 402 is vacuum-sealed.

Figure 35:
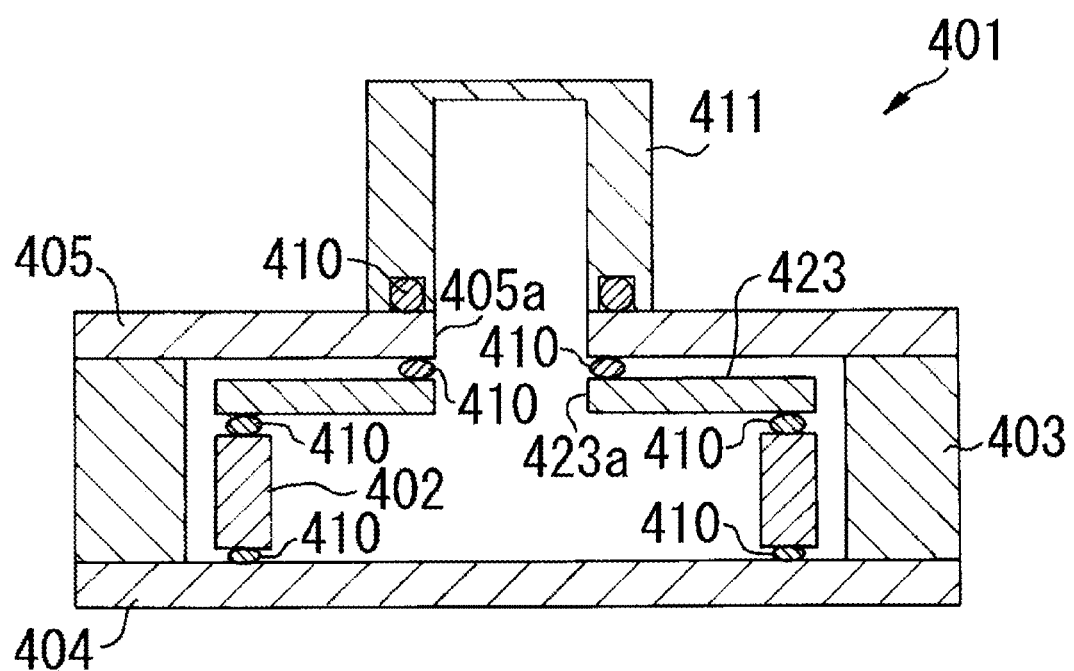
FIG. 35 is a transverse cross-sectional view illustrating the vacuum container according to the fourth embodiment, in which gaps between the inner container, the outer container, and an upper plate are enlarged.

The stage 406 is mounted in the vacuum container 401 having been assembled, and as illustrated in FIG. 35, the lens barrel 411 is mounted on the upper surface of the upper plate 405 so that the inside of the lens barrel 411 and the inside of the vacuum container 401 communicate through the opening portion 405a, and the vacuum container is mounted to the electron beam apparatus. The inside of the lens barrel 411 is sealed by an O-ring sealing structure provided between the lower part of the lens barrel 411 and upper surface of the upper plate 405.

It is noted that devices mounted to a side part of the vacuum container 401 and communicating with the inside of the container, such as a vacuum pump, an air pipe, or an exhaust pipe are not illustrated, but the devices are directly mounted to the inner container 402 by providing vacuum seal, or by providing the vacuum seal only at a part to which the devices are mounted, between the inner container 402 and the outer container 403, and providing the vacuum seal between the outer container 403 and the devices.

According to the vacuum container 401 of the present embodiment configured as described above, upon operation of the electron beam apparatus, the inside of the inner container 402 assembled by welding the steel materials without requiring anti-corrosion treatment is maintained in a vacuum, and is magnetically sealed by the outer container 403 including the magnetic material, and the influence of the external magnetism in the container can be eliminated. Further, the vacuum container 401 includes the inner container 402 and the outer container 403 formed by assembling the four plate materials 421 and 431, respectively, and the lower plate 404 and the upper plate 405 are joined to the inner and outer containers, so that the vacuum container can be produced with lower processing cost.

Further, the lower end of the outer container 403 and the upper surface of the lower plate 404, and the upper end of the outer container 403 and the lower surface of the upper plate 405 are joined by metal-to-metal touch for close contact between the contact surfaces, so that the size from the lower plate 404 to the upper plate 405 is controlled easily, and the size from the lower plate 404 to the upper plate 405, and the size of a part finally defined between the lens barrel 411 and the stage 406 can be prevented from being influenced by the deformation of the inner container 402.

Figure 34:
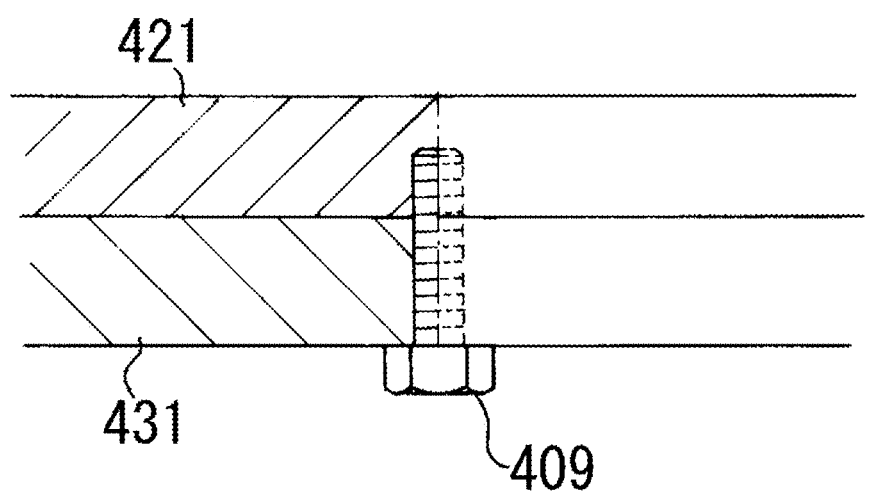
FIG. 34 is a half cutaway view illustrating an overlapping portion between the inner container and the outer container, according to the fourth embodiment, in which side surfaces of the inner and outer containers are connected to each other.

It is noted that the stress, which is generated in the inner container while the electron beam apparatus is operated, and the inside of the apparatus is changed by the vacuum pump from the atmospheric pressure to a vacuum or vice versa, is absorbed by the deformation of the inner container, but in order to reduce the deformation of the inner container 402, the side surface portions of the inner container 402 and the outer container 403 may be fastened with the retaining screw 409 to reduce the inward deformation of the inner container 402 upon decompression, as illustrated in FIG. 34.

FIG. 35 is a diagram illustrating another mode of the vacuum container 401 according to the present embodiment. This mode is configured such that the inner container 402 formed similar to the above-mentioned mode is provided with an inner lid 423 configured to close the upper opening, the inner lid 423 is formed with an opening portion 423a communicating with the inside of the lens barrel 411 formed on the upper plate 405 and having an area substantially the same as the area of the opening portion 405a, the O-ring 410 is provided between the opening portion 423a of the inner lid 423 and the inner surface of the upper plate 405 for vacuum seal, accordingly, the inside of the lens barrel 411 and the inside of the inner container 402 are maintained in a vacuum, and the space between the inner container 402 and the outer container 403 including the upper plate 405 is maintained under atmospheric pressure.

According to this configuration, since the space between the inner container 402 and the outer container 403, and the space between the upper surface of the inner lid 423 and the lower surface of the upper plate 405 are maintained under atmospheric pressure, only the differential pressure corresponding to the projected area of the joint portion of the lens barrel 411 is the main cause of deformation, the main cause of the deformation is considerably small compared with the whole area of the upper plate 405 of the vacuum container 401, and upward and downward deformation of the upper plate 405 due to the differential pressure between the atmospheric pressure and a vacuum is minimized. As a result, the mounting position or orientation of the lens barrel 411 mounted on the upper surface of the upper plate 405 is subjected to minimized influence of the differential pressure, and the high precision of the electron beam apparatus can be achieved.

It is noted that, the exemplary mode of the vacuum container 401, the inner container 402, and the outer container 403 has been illustrated, but the present embodiment is not limited to this mode, and can include any other appropriate mode.

What is claimed is:

1. A vacuum magnetic shield container of an electron beam apparatus including a stage configured to hold a sample, the vacuum magnetic shield container comprising:
   an inner container including a stainless steel material; and
   an outer container including a magnetic steel material different from the material of the inner container, disposed to surround the inner container,
   wherein the inner container holds a vacuum in the container, and
   the outer container magnetically shields the container, the inner container and the outer container respectively have a lower opening,
   the lower openings of both containers are closed with a lower plate,
   the lower plate is brought into direct contact with a lower end of the outer container, and
   a sealing member is provided between an upper surface of the lower plate and a lower peripheral edge of the inner container.

2. The vacuum magnetic shield container according to claim 1, wherein the inner container is composed of members joined by welding or adhesion.

3. The vacuum magnetic shield container according to claim 1, wherein the outer container is composed of members joined by fastening with a retaining screw.

4. The vacuum magnetic shield container according to claim 1, wherein the inner container and the outer container are respectively formed by assembling four plate materials, and
   an upper plate is brought into direct contact with an upper end of the outer container.

5. The vacuum magnetic shield container according to claim 1, wherein a side surface portion of the inner container is fastened to a side surface portion of the outer container with a retaining screw.

6. The vacuum magnetic shield container according to claim 1, wherein an upper part of the outer container is provided with an upper plate on which a lens barrel is mounted,
   an O-ring sealing structure is provided between a lower part of the lens barrel and an upper surface of the upper plate,
   an upper part of the inner container is closed by an inner lid,
   the inner lid is provided with an opening portion having an area substantially the same as that of an opening portion communicating with the inside of the lens barrel formed on the upper plate,
   an O-ring is provided between the opening portion of the inner lid and an inner surface of the upper plate for a vacuum seal,
   the inside of the lens barrel and the inside of the inner container are maintained in a vacuum, and
   a space between the inner container and the outer container is maintained under atmospheric pressure.

* * * * *